(12) United States Patent
Singh

(10) Patent No.: US 11,489,417 B2
(45) Date of Patent: Nov. 1, 2022

(54) PACKAGING OF WIDE BANDGAP POWER ELECTRONIC POWER STAGES

(71) Applicant: Deere & Company, Moline, IL (US)

(72) Inventor: Brij N Singh, West Fargo, ND (US)

(73) Assignee: Deere & Company, Moline, IL (US)

( * ) Notice: Subject to any disclaimer, the term of this patent is extended or adjusted under 35 U.S.C. 154(b) by 83 days.

(21) Appl. No.: 17/072,988

(22) Filed: Oct. 16, 2020

(65) Prior Publication Data

US 2021/0344258 A1 Nov. 4, 2021

Related U.S. Application Data

(60) Provisional application No. 63/018,501, filed on Apr. 30, 2020.

(51) Int. Cl.
*H02K 11/33* (2016.01)
*B60K 1/00* (2006.01)
(Continued)

(52) U.S. Cl.
CPC ............ *H02K 11/33* (2016.01); *B60K 1/00* (2013.01); *B60R 16/03* (2013.01);
(Continued)

(58) Field of Classification Search
CPC .. H05K 1/0215; H05K 1/0228; H05K 1/0233; H05K 1/0243; H05K 1/14; H05K 1/144; H05K 1/18; H05K 1/181; H05K 7/2072; H05K 7/20927; H05K 7/20872; H05K 2201/04; H05K 2201/041; H05K 2201/10189; H05K 2201/10053; H05K 2201/1009; H05K 2201/10272;
(Continued)

(56) References Cited

U.S. PATENT DOCUMENTS 6,166,937 A 12/2000 Yamamura et al.
9,042,147 B2 * 5/2015 Ishii .................. H02M 1/12
361/677

(Continued)

FOREIGN PATENT DOCUMENTS

EP 3598860 A1 1/2020

OTHER PUBLICATIONS

Extended European Search Report and Written Opinion issued in European Patent Application No. 21154056.2, dated Jul. 7, 2021, in 08 pages.

(Continued)

*Primary Examiner* — Hoa C Nguyen
*Assistant Examiner* — John B Freal
(74) *Attorney, Agent, or Firm* — Hanley, Flight & Zimmerman, LLC

(57) ABSTRACT

Design and packaging of wide bandgap (WBG) power electronic power stages are disclosed herein. An example apparatus includes a first printed circuit board (PCB) including: a first voltage phase circuit cluster; a second voltage phase circuit cluster; and a cluster of traces, the cluster of traces routed substantially perpendicular to the second voltage phase circuit cluster; a second PCB positioned below the first PCB; and a connector to connect the first PCB to the second PCB, the connector electrically coupled to the first voltage phase circuit cluster by the cluster of traces.

7 Claims, 18 Drawing Sheets

(51) Int. Cl.
  *B60R 16/03* (2006.01)
  *H01R 12/52* (2011.01)
  *H02K 7/00* (2006.01)
  *H05K 1/14* (2006.01)
  *H05K 1/02* (2006.01)
  *H01L 23/473* (2006.01)
  *H02G 5/10* (2006.01)
  *H05K 7/20* (2006.01)

(52) U.S. Cl.
  CPC ....... *H01L 23/4735* (2013.01); *H01R 12/523* (2013.01); *H02G 5/10* (2013.01); *H02K 7/006* (2013.01); *H05K 1/144* (2013.01); *H05K 7/20272* (2013.01); *H05K 7/20927* (2013.01); *H02K 2211/03* (2013.01); *H05K 1/0233* (2013.01); *H05K 2201/10189* (2013.01)

(58) Field of Classification Search
  CPC .... H02K 7/006; H02K 11/33; H02K 2211/03; B60K 1/00; B60R 16/03; H01L 23/4735; H01R 12/523; H02G 5/10
  See application file for complete search history.

(56) References Cited

U.S. PATENT DOCUMENTS

| | | | |
|---|---|---|---|
| 9,888,596 B2* | 2/2018 | Momose | H05K 5/0239 |
| 10,362,703 B2 | 7/2019 | Blösch et al. | |
| 2010/0026090 A1* | 2/2010 | Nakatsu | B60L 50/61 |
| | | | 307/9.1 |

OTHER PUBLICATIONS

Wikipedia, "Aluminium nitride," last edited Sep. 7, 2020, available online: last retrieved Sep. 29, 2020 from https://en.wikipedia.org/wiki/Aluminium_nitride (8 pages).

The Bergquist Company, "Gap Pad® 3000S30: Thermally Conductive, Reinforced, Soft "S-Class" Gap Filling Material," available online: last retrieved Oct. 16, 2020 from http://disti-assets.s3.amazonaws.com/quistelectronics/files/datasheets/6377.pdf (1 page).

Dow Corning, "Dow Corning® TC-4515 Thermally Conductive Gap Filler," Preliminary Product Information, Jul. 28, 2016 (3 pages).

Bergquist, "Bergquist Gap Filler TGF 3600," Technical Data Sheet, Oct. 2018 (2 pages).

* cited by examiner

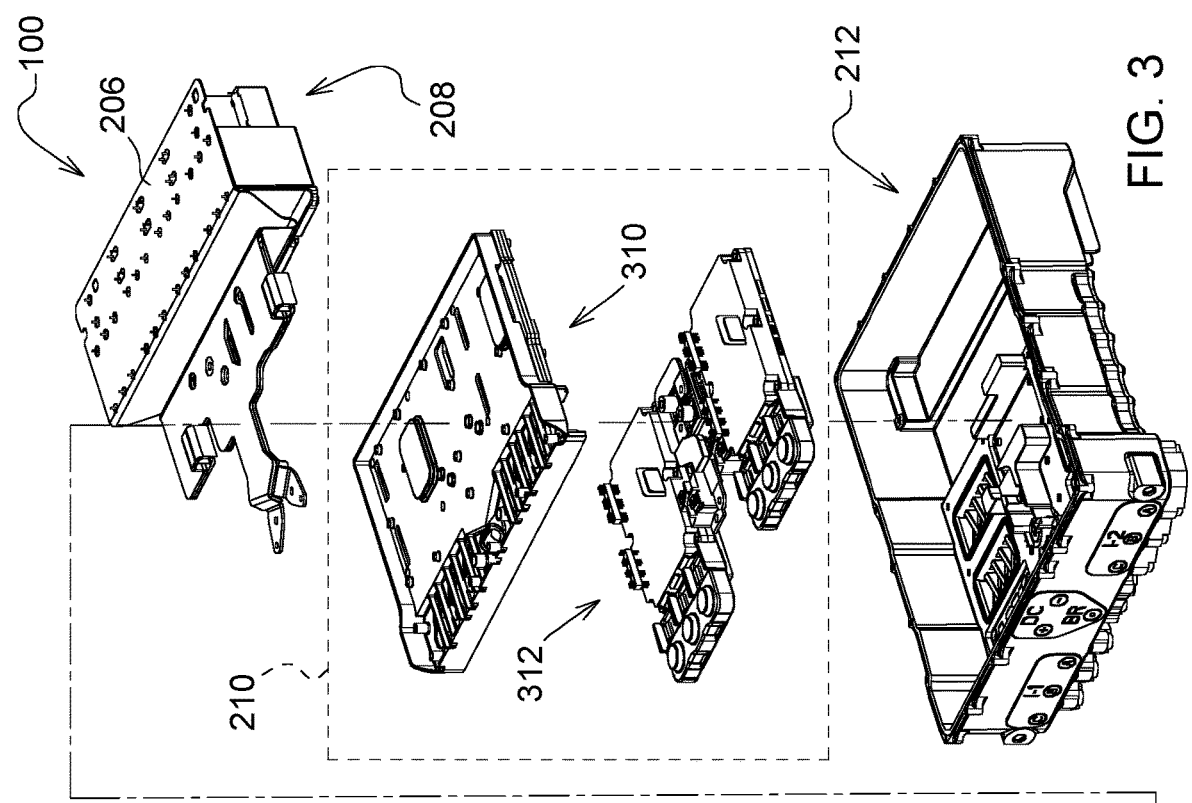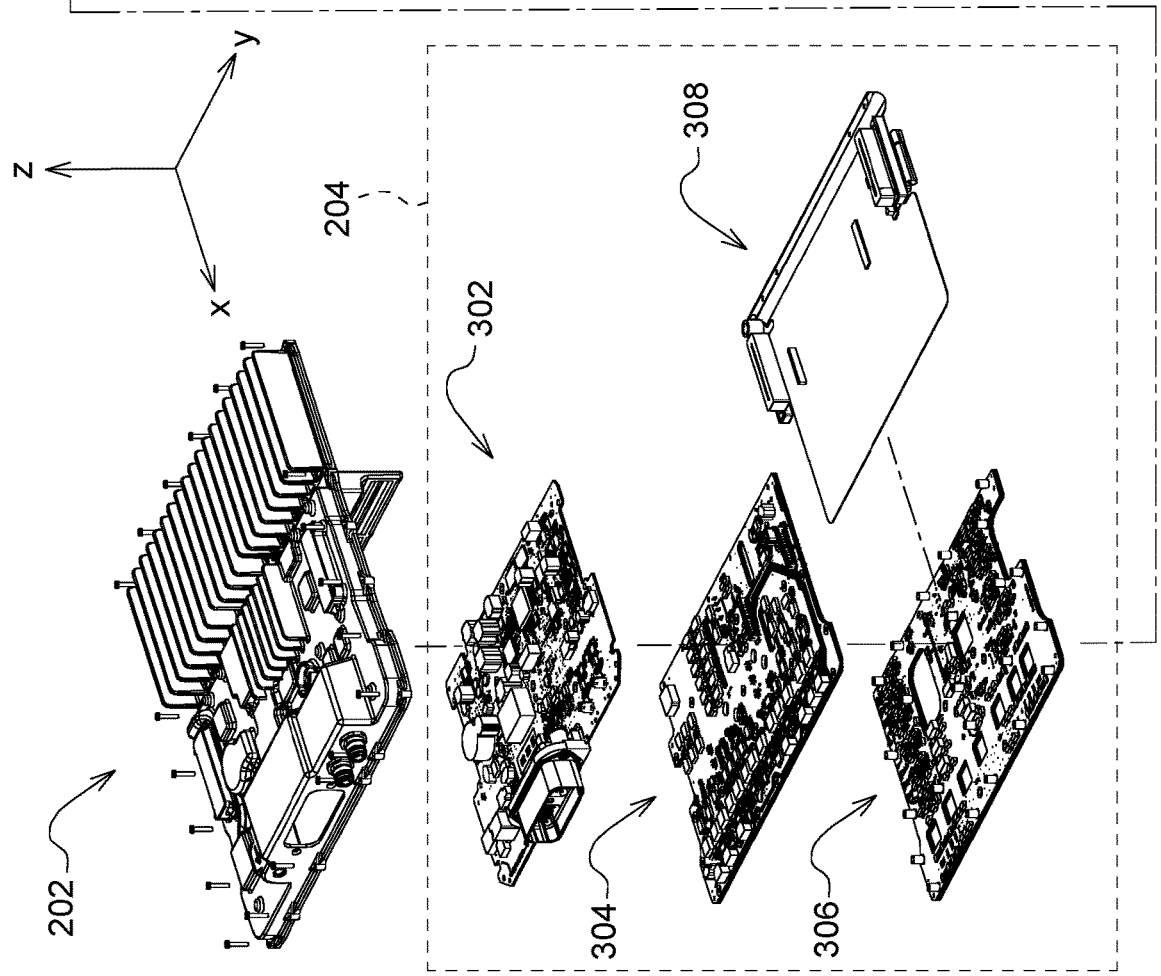
FIG. 3

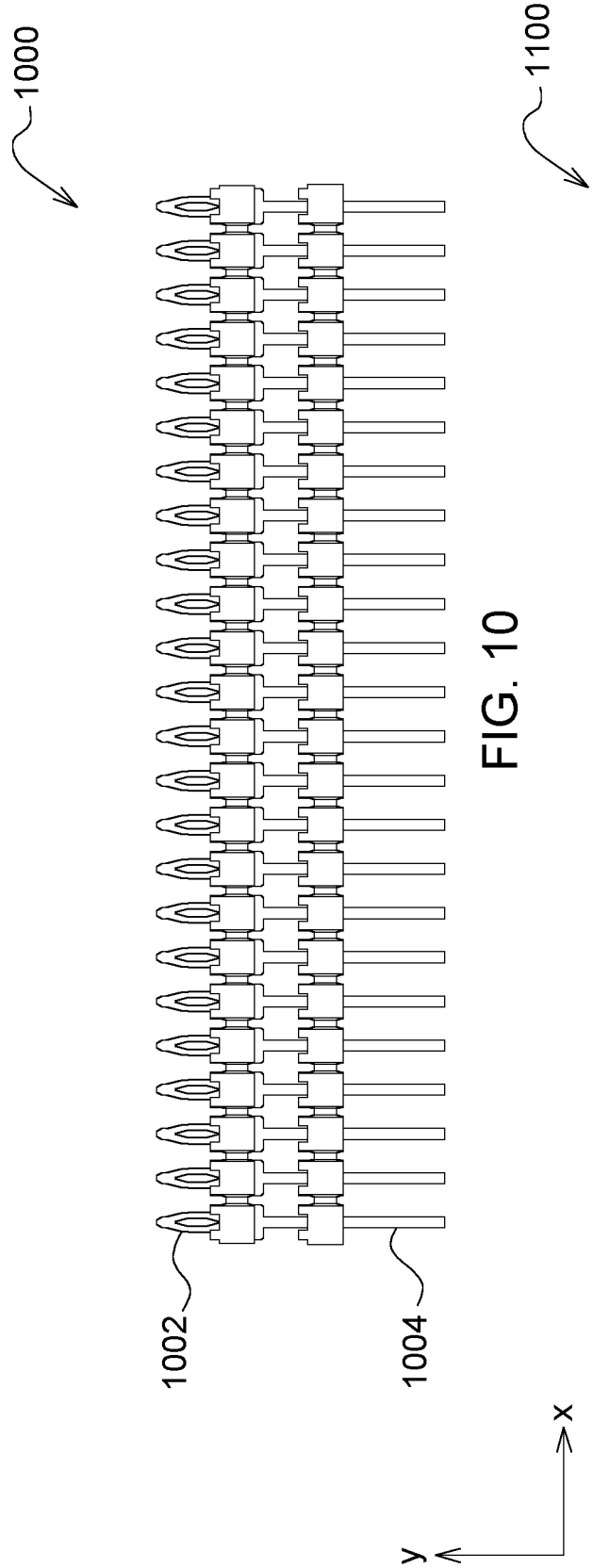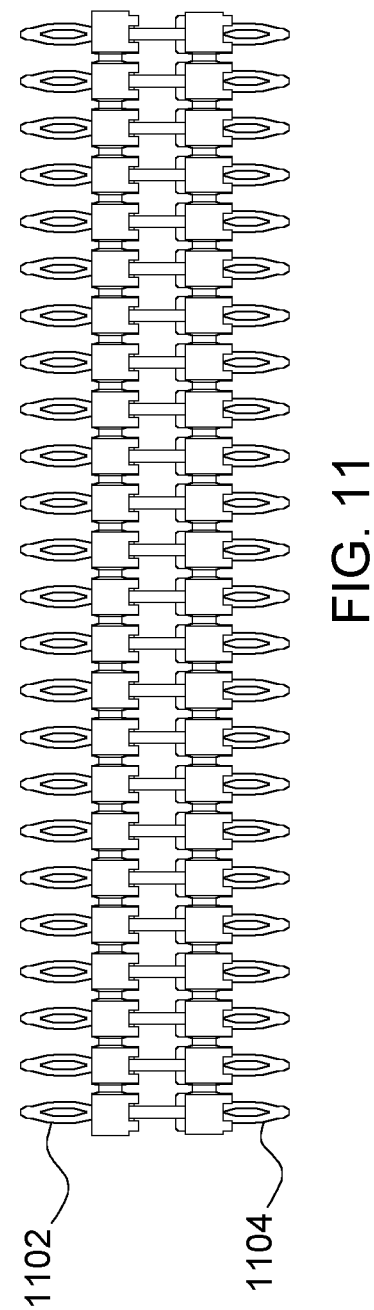

US 11,489,417 B2

PACKAGING OF WIDE BANDGAP POWER ELECTRONIC POWER STAGES

RELATED APPLICATION

This patent arises from an application claiming the benefit of U.S. Provisional Patent Application Ser. No. 63/018,501, which was filed on Apr. 30, 2020. U.S. Provisional Patent Application Ser. No. 63/018,501 is hereby incorporated herein by reference in its entirety. Priority to U.S. Provisional Patent Application Ser. No. 63/018,501 is hereby claimed.

GOVERNMENT LICENSE RIGHTS

This invention was made with Government support under DE-EE0006521 awarded by the United States Department of Energy. The government has certain rights in this invention.

FIELD OF THE DISCLOSURE

This disclosure relates generally to inverters, and, more particularly, to design and packaging of wide bandgap (WBG) power electronic power stages.

BACKGROUND

Power electronics include direct current (DC) to DC converters, DC to alternating current (AC) inverters, AC to DC rectifiers, and AC to AC converters. Power electronics can be used in motor drives, mobile devices, chargers, power adapters, power distribution networks, uninterruptible power supplies, renewable energy systems, electric vehicles, hybrid electric vehicles, among others. Power electronic manufacturers are manufacturing power electronics using WBG semiconductor materials such a silicon carbide (SiC) and gallium nitride (GaN). WBG materials can be utilized as power switches including SiC metal-oxide-field-effect-transistors (MOSFETs) and GaN field-effect-transistors (FETs). WBG semiconductor materials allow for smaller, faster, and more reliable power electronic components while offering higher efficiency compared to silicon-based counterparts.

BRIEF DESCRIPTION OF THE DRAWINGS

FIG. 3 is an exploded view of the assembly of FIG. 1.

FIG. 10 is a schematic illustration of a connector that can be used to couple the upper gate driver board to the lower gate driver board.

FIG. 11 is a schematic illustration of an alternative connector that can be used to couple the upper gate driver board to the lower gate driver board.

Figure 1:
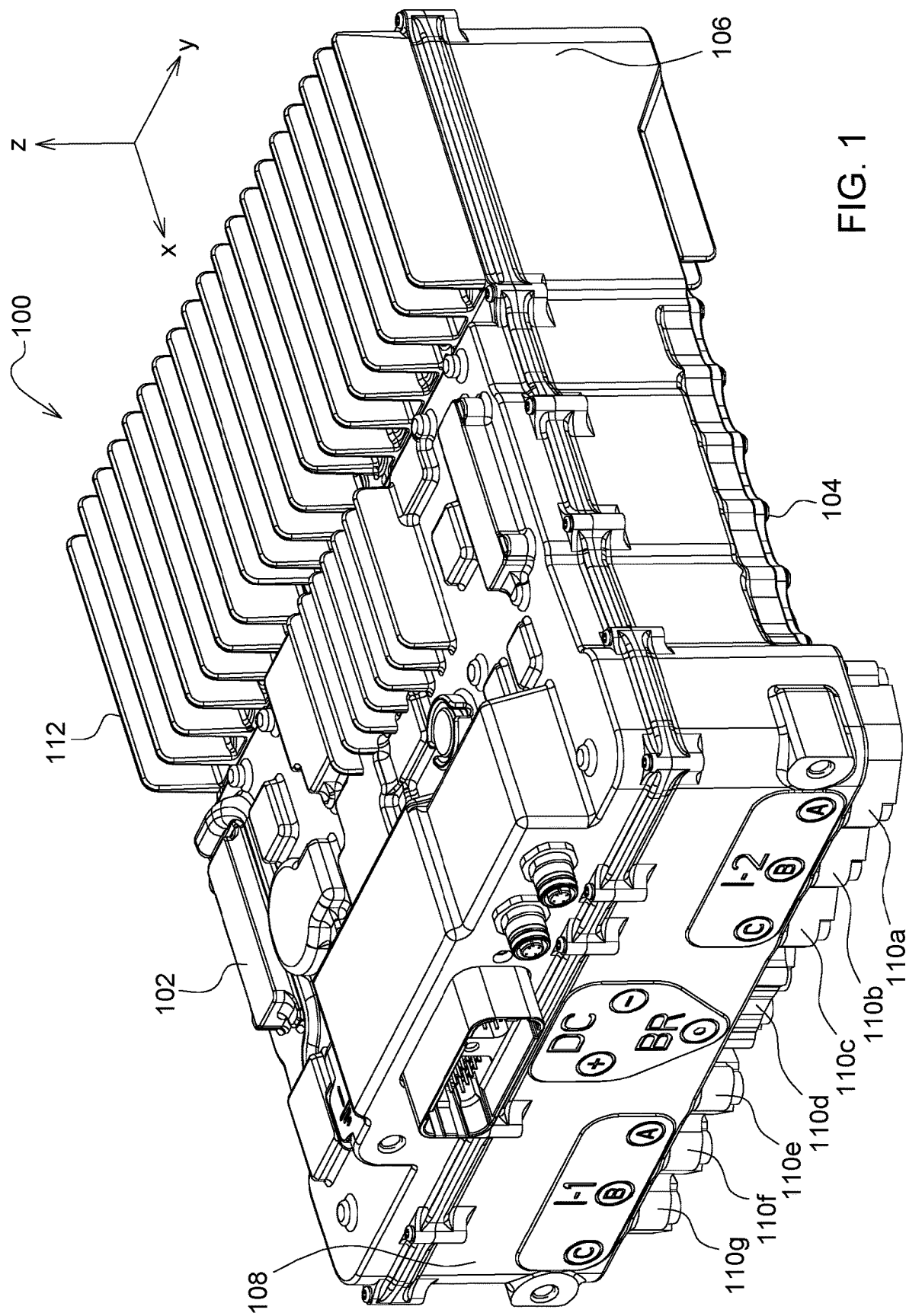
FIG. 1 is a schematic illustration of a wide bandgap semiconductor material-based inverter assembly.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, the orientation of features is described with reference to a lateral axis, a vertical axis, and a longitudinal axis of the vehicle associated with the features. As used herein, the longitudinal axis of a WBG semiconductor material-based inverter is parallel to the centerline of the WBG semiconductor material-based inverter. The terms "rear" and "front" are used to refer to directions along the longitudinal axis closer to the rear of the WBG semiconductor material-based inverter and the front of the WBG semiconductor material-based inverter, respectively. As used herein, the vertical axis of the WBG semiconductor material-based inverter is perpendicular to the ground on which a vehicle including the WBG semiconductor material-based inverter rests. The terms "below" and "above" are used to refer to directions along the vertical axis closer to the ground and away from the ground, respectively As used herein, the lateral axis of the WBG semiconductor material-based inverter is perpendicular to the longitudinal and vertical axes and is generally parallel to the axles of a vehicle including the WBG semiconductor material-based inverter. In general, the attached figures are annotated with a set of axes including the lateral axis (Y), the longitudinal axis (X), and the vertical axis (Z). As used herein, the terms "longitudinal,"

and "axial" are used interchangeably to refer to directions parallel to the longitudinal axis. As used herein, the terms "lateral" and "horizontal" are used to refer to directions parallel to the lateral axis. As used herein, the term "vertical" and "normal" are used interchangeably to refer to directions parallel to the vertical axis As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts. In some examples used herein, "substantially" is used to describe a relationship between two parts that is within ten degrees of the stated relationship (e.g., a substantially perpendicular relationship is within ten degrees of perpendicular, a substantially parallel relationship is within ten degrees of parallel, etc.).

Unless specifically stated otherwise, descriptors such as "first," "second," "third," etc. are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real-world imperfections. In some examples, "approximately congruent" refers to dimensions of a part that may not be exact due to design and manufacturing decisions that were made to allow the part to comply with other parts of an apparatus or system. As used herein "substantially real time" refers to occurrence in a near instantaneous manner recognizing there may be real world delays for computing time, transmission, etc. Thus, in one example, "substantially real time" refers to real time +/−10 s of microseconds while in another example, "substantially real time" refers to real time +/−10 s of nanoseconds.

DETAILED DESCRIPTION

WBG power electronics (e.g., SiC, GaN, etc.) are expected to perform very well and are expected to be extremely power-dense. For example, extremely power dense WBG power electronics are expected to be at least four to five times smaller than silicon-based power electronics. Additionally, WBG power electronics typically operate at far higher temperature compared to silicon-based counterpart. In addition to extremely high power-density compared to silicon-based power electronics, WBG electronics are expected to offer high efficiency. These expectations pose significant challenges in design, manufacturing, and operation of WBG power electronics. Because of the wide array of power electronics applications, WBG power electronics should be designed with the low-cost and smaller-footprint yet high-reliability film capacitors that can successfully co-exist with high-temperature WBG power switches. However, such film capacitors are temperature sensitive. Thus, it is difficult to reduce the size of WBG power electronics while accommodating for the temperature requirements of other components of the power electronics system.

Examples disclosed herein relate to design and packaging of WBG device-based power electronic systems and power stages. Examples disclosed herein achieve high efficiency (e.g., greater than 98% at full load and/or over the recommended coolant temperature) while operating with high-temperature coolant and/or handling full load current required (e.g., requested) by vehicle traction systems (e.g., heavy-duty vehicle traction systems). The example six-pack (e.g., three-phase) SiC MOSFET power module (e.g., including SiC MOSFETs) disclosed herein facilitate, in part, extremely high power-density. Examples disclosed herein aggressively cool capacitors in the DC bus assembly and effectively couple the capacitor assembly with the ambient air around the SiC inverter. Examples disclosed herein include a vertically stacked, multi-board control system to drive and control the power switches. The disclosed stacked system provides reduced size of the SiC inverter, increased power density, and reduced electromagnetic interference (EMI).

Examples disclosed herein include tightly grouped circuitry for each phase of the SiC inverter gate driver. The SiC inverter gate driver drives not only the generator (e.g., to generate AC current), but also an AC motor, and a braking system. Each phase of the generator, the motor, and the braking system includes tightly grouped circuitry. The tightly grouped nature of the circuits isolates high voltage deviation and/or high changes in the voltage (e.g., dv/dt, change in voltage with respect to time, etc.) of one phase with respect to the others. Additionally, examples disclosed herein decouple phases from one another (e.g., reduce EMI) by routing current carrying traces that pass between different boards of the multi-board gate driver substantially perpendicular to other current carrying traces of other phases that have wide ranging and highly variable voltage levels. In this manner, despite the possibility of wide ranging and highly variant voltage levels on different phases, the substantially perpendicular routing electrically and magnetically decouples the traces and reduces noise. The substantially perpendicular routing of traces ensures that magnetically coupled noise that may be injected from one phase (e.g., a voltage class) to other phases (e.g., other voltage classes) is reduced (e.g., minimized, reduced to a negligible level, etc.).

Additionally, due to the stacked nature of the multi-board gate driver, examples disclosed herein advantageously position tightly grouped circuitry above related tightly grouped circuitry (e.g., circuitry that operates on the same or similar signals). This positioning advantageously reduces the electrical distance traveled by the signals in the circuitry despite the physical distance being relatively large. This positioning advantageously reduces electrical and magnetic coupling and allows, in part, for the overall package size of the SiC inverter to be reduced.

Examples disclosed herein additionally include output phase current sensors at the AC output terminal of the SiC inverter. The output terminals of the current sensors are coupled to wire-based connectors that couple the current sensors to the control board. Advantageously, the wire-based connectors pass through cylindrical ferrite cores to reduce noise and any EMI coupling to the sensed current signal. The example ferrite cores encircling the wire-based connectors as disclosed herein advantageously reduce (e.g., prevent) undesirable EMI coupling between the wire-based connectors and the sensed current signal. Such undesirable EMI may occur and/or originate due to the high frequency and high edge rate switching of voltage (e.g., high frequency operation, dv/dt, changes in voltage with respect to time, etc.) and current (e.g., di/dt, changes in current with respect to time, etc.) of power devices used in the SiC inverter. With the addition of the cylindrical ferrite cores, examples disclosed herein ensure that the uncorrupted current sensor data is provided to the control board of the SiC inverter for accurate execution and implementation of control commands in addition to a rapid response for protection of the power switches. As such, examples disclosed herein enable control logic of the SiC inverter to appropriately and swiftly disable the power switches of the SiC inverter in the event of over-current or other possible faults experienced by the SiC inverter.

Examples disclosed herein additionally include a DC bus bar associated with the capacitor bank of the SiC inverter and the power switches of the inverter. The example capacitor bank disclosed herein includes multiple capacitors coupled to the DC bus bar (e.g., planar DC bus bar). The example capacitors of the capacitor bank are coupled to the DC bus bar via press-fit pins of the capacitors connected to press-fit holes of the DC bus bar. Additionally, the example DC bus bar disclosed herein is coated with a dielectric thermal interface material (TIM) with high thermal conductivity (e.g., a TIM including high thermal conductivity). The example dielectric TIM disclosed herein improves thermal conductivity and electrically insulates the DC bus bar. For example, the dielectric TIM may be implemented by aluminum oxide ($Al_2O_3$), GAP3000S30R, aluminum nitride (AlN), Bergquist gap filler 3500S35, and/or Dow Corning® TC-4515 thermally conductive gap filler. In any implementation, the dielectric TIM can include micro-sized and/or nano-sized silver beads that are embedded in the dielectric TIM to significantly increase thermal conductivity while maintaining insulation properties.

Additionally, the dielectric TIM may be implemented by non-silicone based material filled with thermally conductive fillers such as Zink Oxide, Aluminum, Alumina, among others, that effectively make a strong thermal contact between DC bus bar and the SiC inverter case which includes heat-dissipating fins. The dielectric TIM (sometimes referred to as a phase change material) can also be used in packaging the SiC inverter to effectively tie the temperature of the DC bus bar to the temperature of the SiC inverter case which includes heat-dissipating fins. In some examples, the dielectric TIM (e.g., the phase change material) includes thermal conductivity as high as 8.5 W/(m-K).

By increasing the surface area of the region of the DC bus bar associated with the capacitor bank, examples disclosed herein advantageously thermally decouple the capacitor bank from the power switches. The example region of the DC bus bar disclosed herein includes two subregions, a first subregion that is positioned above the capacitor bank with an approximately congruent surface area (e.g., a substantially similar) to that of the top side of the capacitor bank and a second subregion that curves downward along the front face of the capacitor bank and extends into a cavity between the capacitor bank and the power switching/multi-board gate driver region of the SiC inverter. In examples disclosed herein, the second subregion of the region of the DC bus bar associated with the capacitor bank is tapered slightly but includes a relatively large surface area similar to that of the front face of the capacitor bank.

Examples disclosed herein additionally include one or more manifolds (sometimes referred to as mini-manifolds) and one or more channels (sometimes referred to as mini-channels) to cool the power switches. At least some of the manifolds are located under the power switches. Coolant is pumped into the manifolds and flows through the channels. The manifolds and channels together create a turbulent flow of the coolant, which advantageously increases the heat dissipated into the coolant from the power switches by significantly raising a heat transfer coefficient between the junction of the power semiconductor and coolant flowing in channels.

The example manifold and channels disclosed herein reduce the amount of coolant that decreases in pressure and reduce the amount by which the pressure of such coolant decreases. Thus, due to the reduction in coolant pressure drop and/or coolant volume experiencing pressure drop, the example manifold and channels disclosed herein reduce the power expended in pumping coolant to thermally manage the SiC inverter. Additionally, the example manifolds and channels disclosed herein disclosed herein enable efficient thermal management of the SiC inverted by reducing the flow rate of coolant. Therefore, the example manifolds and channels disclosed herein not only increase the high heat flux at which the SiC inverter can operate (367 W/cm$^2$ at 70° C. coolant, and 170 W/cm$^2$ at 115° C. coolant) but also reduce the volume of coolant needed resulting in a reduction of the coolant reservoir size.

FIG. 1 is a schematic illustration of a WBG semiconductor material-based inverter assembly 100. The assembly 100 includes an example top side 102, an example bottom side 104, an example right side 106, an example left side (not shown), an example front side 108, and an example back side (not shown). The example bottom side 104 includes example output current terminals 110*a*, 110*b*, 110*c*, 110*d*, 110*e*, 110*f*, and 110*g*. The top side 102 includes an example first heat sink 112.

In the illustrated example of FIG. 1, the assembly 100 is an SiC inverter for use in electric vehicles to provide traction control. For example, the assembly 100 includes a 200 kW, 1,050 VDC bus SiC dual inverter that has increased power densities and can operate at a higher temperature compared to other inverters, such as silicon insulated gate bipolar transistor (IGBT) based inverters. The assembly 100 includes power electronics, heat exchangers, printed circuit boards (PCBs), AC and DC bus-bars, coreless current sensors, among other things. The assembly 100 may be coupled to a battery, a motor, a braking system, and a heat exchanger of a vehicle (e.g., a radiator). The assembly 100 an extremely power dense SiC inverter that achieves compact design with reduced electrical and magnetic interference. For example, the assembly 100 includes a power density of 43 kW/L. The assembly 100 miniaturizes (e.g., reduces) the size of the power electronics while achieving improvements in capability and performance. The example first heat sink 112 is a heat sink positioned above the capacitor bank (discussed below) and increases the exchange between the capacitor bank and the ambient air around the assembly 100. The first heat sink 112 is a part of the enclosure of the assembly 100 but in other examples, the first heat sink 112 can be affixed to the assembly 100. The first heat sink 112 aids in dissipating the heat generated by the capacitor bank and any stray heat originating from an SiC power switching module included in the assembly 100.

Figure 2:
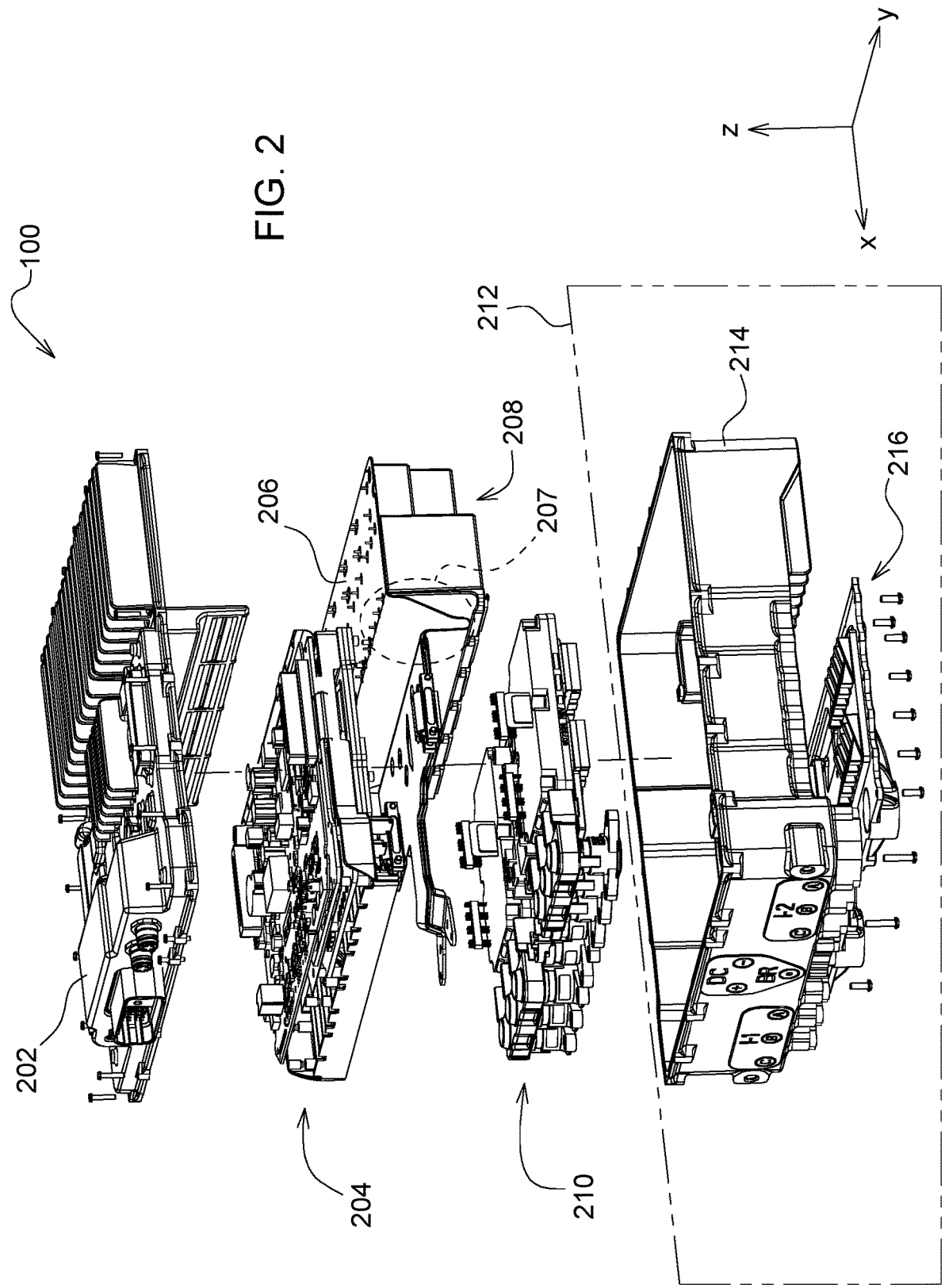
FIG. 2 is a partially exploded view of the assembly of FIG. 1.

FIG. 2 is a partially exploded view of the assembly 100 of FIG. 1. The partially exploded view of the assembly 100 includes an example top cover 202 of the assembly 100, an example printed circuit board (PCB) assembly 204, an example DC bus bar 206, an example capacitor bank 208, an example power switching assembly 210, and an example bottom cover 212 of the assembly 100. The bottom cover 212 includes an example bottom enclosure 214 and an example manifold cover 216.

In the illustrated example of FIG. 2, the top cover 202 is mechanically affixed to the bottom cover 212, and specifically to the bottom enclosure 214. The top cover 202 encases the top side of the SiC inverter and aids in heat dissipation to decouple the power switching assembly 210 from the capacitor bank 208. For example, the top cover 202 extends into and fills a cavity 207 between a power switching region of the DC bus bar 206 and the capacitor bank region of the DC bus bar 206. This extension of the top cover 202 allows the top cover 202 to dissipate heat from the increased surface area of the DC bus bar 206.

In the illustrated example of FIG. 2, the PCB assembly 204 includes electrical components and mechanical components. The PCB assembly 204 includes a control board, a first gate drive board, and a second gate driver board. The PCB assembly 204 functions to control the power switches of the power switching assembly 210. The PCB assembly 204 provides for reduced electrical and magnetic interference with a small footprint relative to other inverters.

In the illustrated example of FIG. 2, the DC bus bar 206 is a metal conductor that is coated with a thermal interference material (TIM) including $Al_2O_3$. The DC bus bar 206 includes press fit holes structured to receive press fit pins of the capacitors included in the capacitor bank 208 (discussed further herein). The TIM includes 3.0 W/m-K thermal conductivity for 0.25 mm thickness. The TIM ensures air free bonding between the top cover 202 and the DC bus bar 206. Alternative example implementations of the TIM include GAP3000S30R, aluminum nitride (AlN), Bergquist gap filler 3500S35, and Dow Corning® TC-4515 thermally conductive gap filler. In any implementation, the TIM can include micro-sized (e.g., on the scale of micrometers (μm)) and nano-sized (e.g., on the scale of nanometers (nm)) silver beads that are embedded in the TIM to significantly increase thermal conductivity while maintaining electrical insulation properties. The DC bus bar 206 is a laminated ultra-low-inductance bus bar between both sides of the dual inverter (e.g., the capacitor bank side and the power switching assembly side). This ultra-low inductance bus bar ties DC terminals of both side of dual inverter. The DC bus bar 206 includes a large surface area in the region above the capacitor bank 208 that allows very effective thermal contact and/or connection between the capacitor bank 208 and the top cover 202. Thus, the heat sinks on the top cover 202 (e.g., the first heat sink 112) can better transfer heat to the ambient environment around the assembly 100. The large surface area of the DC bus bar 206 reduces the thermal resistance between the TIM coated metal (e.g., copper, aluminum, etc.) and the top cover 202. The top cover 202 can additionally be coated with the same or a different TIM as the DC bus bar 206. The DC bus bar 206 is coupled to the power switching assembly via a clamp connection.

The DC bus bar 206 includes DC+ and DC− copper sheets (e.g., the DC bus bar 206 includes positive and negative voltage bus sheets), each coated with TIM (e.g., $Al_2O_3$, GAP3000S30R, AlN, Bergquist gap filler 3500S35, Dow Corning® TC-4515, etc.) to ensure that the DC bus bar 206 is isolated from voltages as large as two-and-a-half times the nominal operating voltage of the DC bus bar 206. The large surface area of the DC bus bar 206, when coated with the dielectric TIM (e.g., coating or filling) between DC+ and DC− sheets of the DC bus bar 206, functions as distributed decoupling parallel plate capacitor to decouple the DC bus from the high frequency switching at the power switching assembly 210. For example, the large surface area of the DC bus bar 206 function as a snubber capacitor. As such, the DC bus bar 206 reduces the component count of the assembly 100 by eliminating the physical placement of the voltage suppressor capacitors across SiC power modules of the power switching assembly 210.

In the illustrated example of FIG. 2, the capacitor bank 208 includes multiple capacitors, each including press-fit pins structured to be inserted into the press fit holes of the DC bus bar 206. The capacitors of the capacitor bank 208 are implemented as film capacitors. The capacitor bank 208 is mechanically coupled to the DC bus bar 206 via press fit connections. The capacitor bank 208 functions as the source of ripple current caused by switching of the SiC power modules of the power switching assembly 210. The capacitor bank 208 also stabilizes voltage levels at the DC bus bar 206 and ensures that voltages at the DC bus bar 206 exhibit reduced (e.g., minimum) voltage sag and/or swell when the power demanded by the SiC inverter changes due to torque commanded by the operator of a vehicle including the SiC inverter.

In the illustrated example of FIG. 2, the power switching assembly 210 includes six-pack SiC power modules. Due to laminated TIM coated DC bus bars 206, inductance between generator and traction drive is reduced as the TIM coating has not only met voltage isolation and creepage ratings, but has also reduced (e.g., nullified) any physical separation between positive (DC+) and negative (DC−) buses of the DC bus bar 206. The reduced inductance results in fast power transfer between both generator and traction drives packed in the Gen-2 SiC inverter box. This indirectly provides for fast response to torque commanded by the vehicle operator with reduced (e.g., minimal) sag in the DC bus voltage of the SiC inverter that lasts for a negligibly small duration, such as under 20 milliseconds (ms).

In the illustrated example of FIG. 2, the bottom enclosure 214 houses the PCB assembly 204, the DC bus bar 206, the capacitor bank 208, and the power switching assembly 210. For example, the power switching assembly 210 is positioned above the manifold cover 216 with the DC bus bar 206 stacked on top of the power switching assembly 210 and the capacitor bank 208 as illustrated in FIG. 2. The PCB assembly 204 is stacked on top of the DC bus bar 206 and the top cover 202 encases the bottom enclosure 214. The manifold cover 216 is mechanically and thermally coupled to the bottom of the bottom enclosure 214 and functions as an inlet and outlet of coolant to the manifold (discussed below). The manifold cover 216 also functions as sealing system for the coolant that comes in contact of the baseplate of the power switching assembly 210. In examples disclosed herein, the coolant includes water-ethylene-glycol (WEG).

FIG. 3 is an exploded view of the assembly 100 of FIG. 1. The exploded view of the assembly 100 of FIG. 3 includes the example top cover 202, the example PCB assembly 204, the example DC bus bar 206, the example capacitor bank 208, the example power switching assembly 210, and the example bottom cover 212.

In the illustrated example of FIG. 3, the example PCB assembly 204 include an example control board 302, an example upper gate driver board 304, an example lower gate driver board 306, and an example tray 308. Together, the upper gate driver board 304 and the lower gate driver board 306 form the gate driver board of the SiC inverter. The example power switching assembly 210 includes an example power switch cover 310 and an example power switching module 312.

Figure 4:
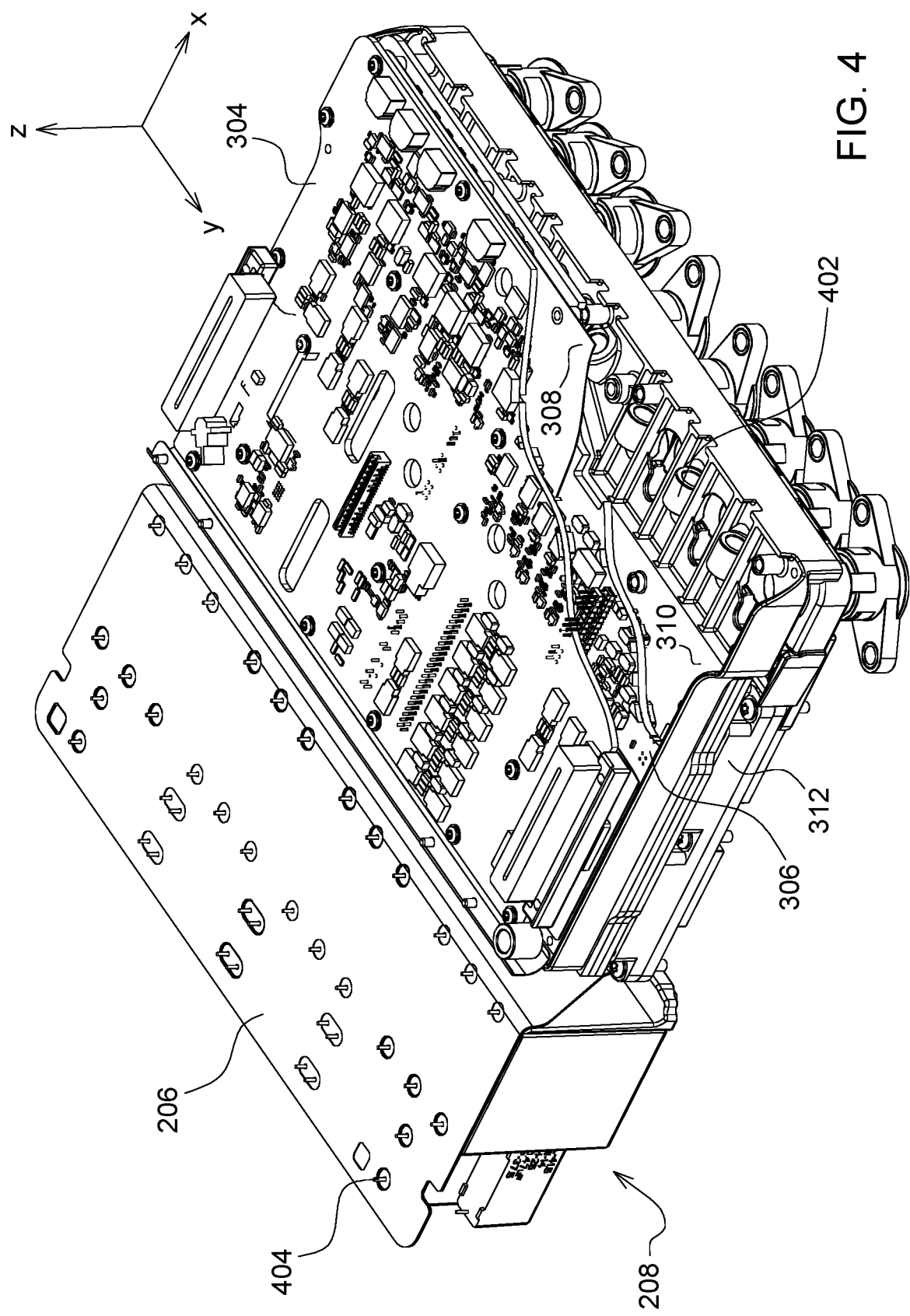
FIG. 4 is a schematic illustration of a cross section of a portion of the assembly of FIG. 1 including multiple ferrite cores, among other things.

FIG. 4 is a schematic illustration of a cross section of a portion of the assembly 100 of FIG. 1 including multiple ferrite cores, among other things. a cross section of a portion of the assembly 100 of FIG. 1 includes the example DC bus bar 206, the example capacitor bank 208, the example upper gate driver board 304, the example lower gate driver board 306, the example tray 308, the example power switch cover 310, the example power switching module 312, an example ferrite core 402, and an example press fit connection 404.

In the illustrated example of FIG. 4, the DC bus bar 206 shown in FIG. 3 includes two subregions, a first subregion that is positioned above the capacitor bank 208 with an approximately congruent surface area (e.g., a substantially similar) to that of the top side of the capacitor bank 208 and a second subregion that curves downward along the front face of the capacitor bank 208 and extends into a cavity between the capacitor bank 208 and the power switching region of the SiC inverter. In the example of FIG. 4, the second subregion of the region of the DC bus bar 206 associated with the capacitor bank 208 is tapered slightly but includes a relatively large surface area similar to that of the front face of the capacitor bank 208. In the example of FIG. 4, the capacitor bank 208 is coupled to the DC bus bar 206 via press fit connection 404. The press fit connection 404 may be referred to herein as a "fresh-fit" connection or variants thereof. For example, capacitors of the capacitor bank 208 include press fit pins that are inserted into press fit holes included in the DC bus bar 206 to form the press fit connection 404. As such, the press fit pins of the capacitors of the capacitor bank 208 and the press fit holes of the DC bus bar 206 reduce capital expended in production of the SiC inverter.

In the illustrated example of FIG. 4, the upper gate driver board 304 is mechanically and electrically coupled to the lower gate driver board 306. The upper gate driver board 304 is positioned above the lower gate driver board 306 and both boards are positioned above the tray 308, the power switch cover 310, and the power switching module 312. The ferrite core 402 is a cylindrical ferrite core including a through hole to receive a wire-based connector from current sensors. The cylindrical ferrite core 402 reduces noise and any EMI coupling that may occur between the high frequency switching of the power switching module 312 and the current sensor signals. With the addition of the cylindrical ferrite core 402, the control board 302 (not shown) can detect current sensor data for a rapid response for protection of the power switching module 312 in order to disable the power switches in the event of a fault that leads to an over current condition.

As such, examples disclosed herein describe a planar bus bar (e.g., the DC bus bar 206) that couples six pack (three-phase) SiC power modules to a DC bus capacitor bank (e.g., the capacitor bank 208). The example planar bus bar described here also functions as a decoupling capacitor. The large planar surface of the DC bus bar (e.g., the DC bus bar 206) between SiC power modules (e.g., the power switching assembly 210) and the DC bus capacitor bank (e.g., the capacitor bank 208) is tied to the case (e.g., the top cover 202) of the SiC inverter to ensure that heat dissipated by the SiC power modules (e.g., a high-temperature region) does not increase the temperature of the DC bus capacitor bank (e.g., a low-temperature region).

Figure 5:
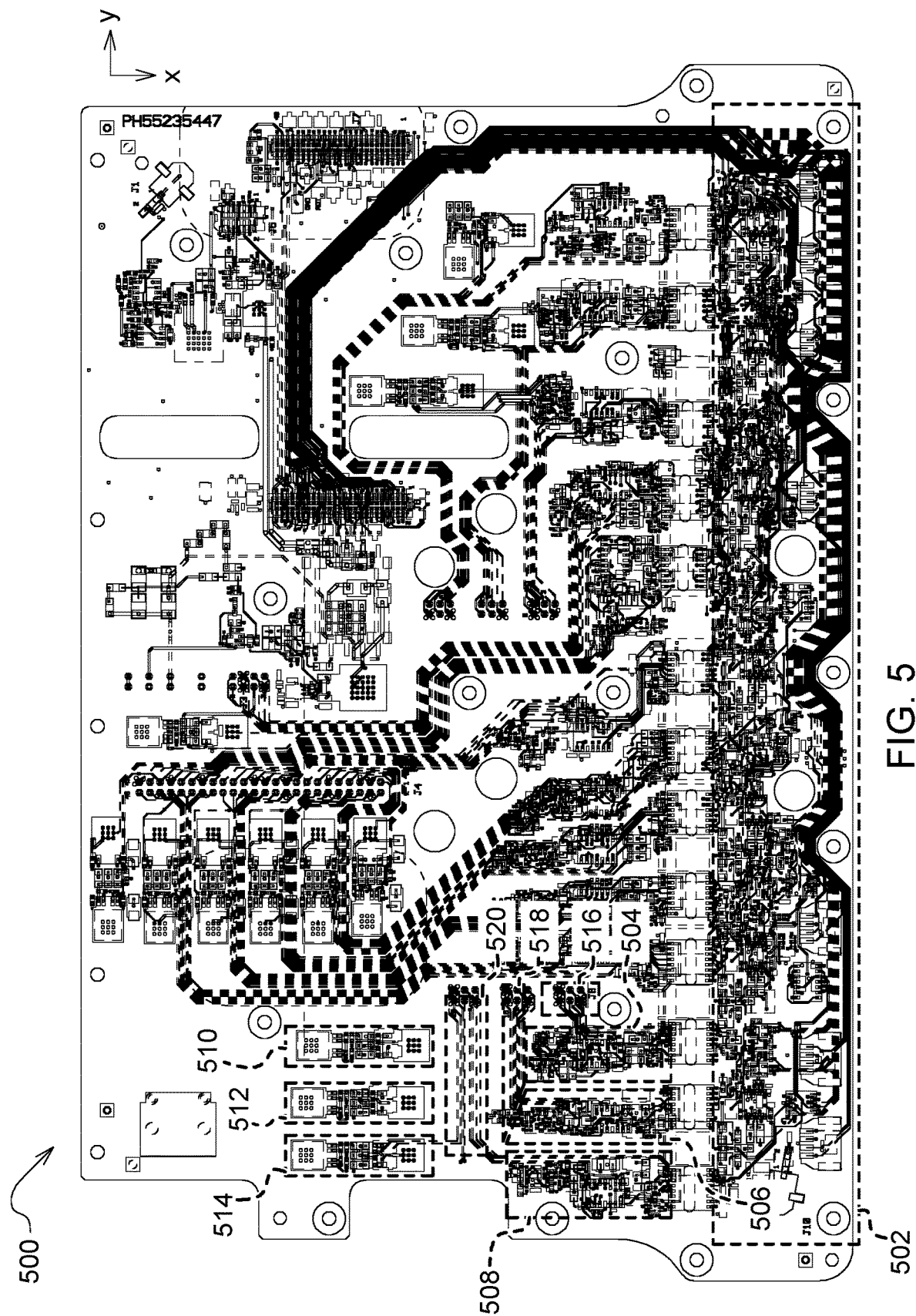
FIG. 5 is a schematic illustration of the top-side view of the upper gate driver board.

FIG. 5 is a schematic illustration of the top-side view 500 of the upper gate driver board 304. FIG. 5 illustrates how gate drive signals are routed from the control board through digital isolators to a drive stage including board-to-board "fresh-fit" connectors to assemble the electrical circuits of the top and bottom boards. It is noted that due to limited space availability and alignment of board-to-board connector and signal flow from the control board to the final gate-source pin pair of the SiC power switches, the circuits with different voltage classes are split into multiple clusters. The associated design challenges include providing isolated power supplies (voltage nets) for each voltage class that vary between +20 V and −5 V around a reference ground plain.

In the illustrated example of FIG. 5, the top-side view 500 includes an example low voltage area 502, an example first high voltage phase circuit cluster 504, an example second high voltage phase circuit cluster 506, an example third high voltage phase circuit cluster 508, an example first high voltage phase driver circuit cluster 510 for regulated power supplies, an example second high voltage phase driver circuit cluster 512 for regulated power supplies, an example third high voltage phase driver circuit cluster 514 for regulated power supplies, an example first cluster of traces 516 for the first phase, an example second cluster of traces 518 for the second phase, and an example third cluster of traces 520 for the third phase.

In the illustrated example of FIG. 5, the example low voltage area 502, the example first high voltage phase circuit cluster 504, the example second high voltage phase circuit cluster 506, the example third high voltage phase circuit cluster 508, the example first high voltage phase driver circuit cluster 510 for regulated power supplies, the example second high voltage phase driver circuit cluster 512 for regulated power supplies, the example third high voltage phase driver circuit cluster 514 for regulated power supplies include active and passive circuit elements to aid in driving the power switches of the power switching module 312. The first high voltage phase driver circuit cluster 510 for regulated power supplies drives the first high voltage phase circuit cluster 504. The second high voltage phase driver circuit cluster 512 for regulated power supplies drives the second high voltage phase circuit cluster 506. The third high voltage phase driver circuit cluster 514 for regulated power supplies drives the third high voltage phase circuit cluster 508.

In the illustrated example of FIG. 5, the first cluster of traces 516 for the first phase electrically couple the first high voltage phase driver circuit cluster 510 for regulated power supplies and the first high voltage phase circuit cluster 504 to a connector (discussed hereinbelow) to connect the first phase circuit clusters to the lower gate driver board 306. The second cluster of traces 518 for the second phase electrically couple the second high voltage phase driver circuit cluster 512 for regulated power supplies and the second high voltage phase circuit cluster 506 to a connector (discussed hereinbelow) to connect the second phase circuit clusters to the lower gate driver board 306. The third cluster of traces 520 for the third phase electrically couple the third high voltage phase driver circuit cluster 514 for regulated power supplies and the third high voltage phase circuit cluster 508 to a connector (discussed hereinbelow) to connect the third phase circuit clusters to the lower gate driver board 306.

In the illustrated example of FIG. 5, the low voltage area 502 is isolated from the other clusters and traces by an isolation barrier (e.g., optic, galvanic, capacitive, etc.). The clusters 504, 506, 508, 510, 512, and 514 are tightly grouped. The tightly grouped nature of the circuits isolates (e.g., decouples) high voltage deviation and/or high changes in the voltage of one phase with respect to the others.

In the illustrated example of FIG. 5, the first phase, second phase, and third phase circuit clusters correspond to the generator of the SiC inverter. As such, the phases can include varying voltages and very high dv/dt. For example, the high side of the generator driver circuit clusters (e.g., 510, 512, 514) are floating grounds. That is, the voltage level at the high side of the generator gate driver circuit clusters (e.g., 510, 512, 514) for regulated power supplies is variable. Although the driver circuit clusters 510, 512, and 514 for regulated power supplies are placed closely to one another, this placement fulfills requirements of creepage and clearance with negligible cross-coupling. Some signals have no variations with respect to different voltage phase circuits contrary to other signals that have varying voltages. For example, with respect to the ground plains of the different voltage phases, these voltage nets can oscillate between 10,000 s to 12,0000 s of volts/ms. This design challenge makes the voltage nets very susceptible to dv/dt related coupled current flowing from one voltage class to other voltage class.

In the illustrated example of FIG. 5, the different phases are decoupled from one another (e.g., reduce EMI) by routing current carrying clusters of traces (e.g., 516, 518, 520) that pass between different boards of the multi-board gate driver substantially perpendicular to other current carrying traces of other phases (e.g., 510, 512, 514) that have wide ranging and highly variable voltage levels. In this manner, despite the possibility of wide ranging and highly variant voltage levels on different phases, the substantially perpendicular routing electrically and magnetically decouples the traces and reduces noise.

In the illustrated example of FIG. 5, only the high voltage generator circuit clusters have been discussed. However, the techniques and advantages thereof additionally apply to the low voltage clusters and/or high voltage clusters and circuits design techniques of the high voltage generator are applicable to the circuits of the AC motor, and to the circuits for the electric braking system.

Figure 6:
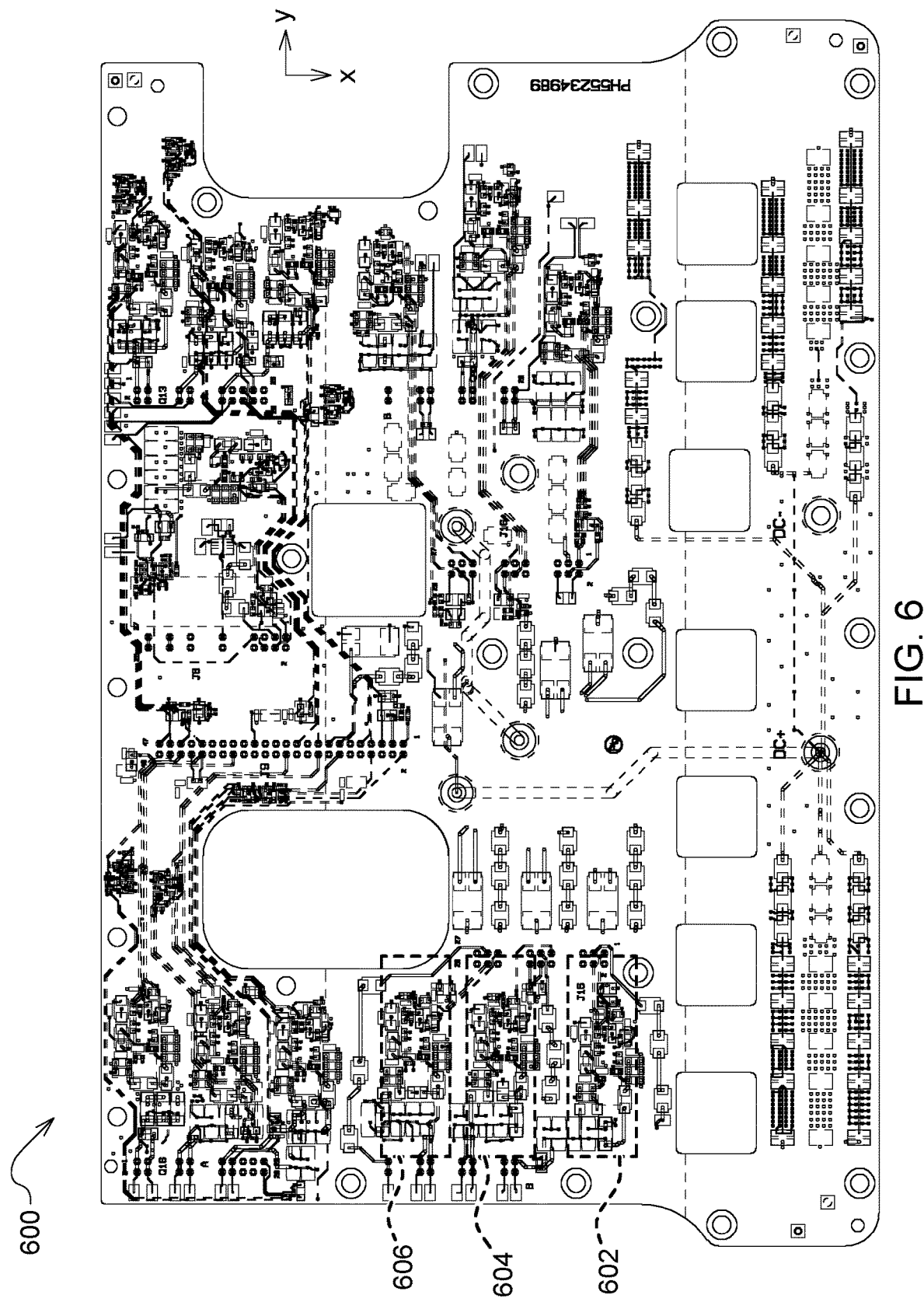
FIG. 6 is a schematic illustration of the top-side view of the lower gate driver board.

FIG. 6 is a schematic illustration of the top-side view 600 of the lower gate driver board 306. The top-side view 600 includes an example first high voltage phase circuit cluster 602 of the final driver stage, an example second high voltage phase circuit cluster 604 of the final driver stage, and an example third high voltage phase cluster 606 of the final driver stage. The clusters 602, 604, and 606 are tightly grouped and remain magnetically and electrically isolated from each other to reduce (e.g., minimize) dv/dt coupled noise from one cluster affecting operation of other clusters.

The example design disclosed herein ensures signal integrity is not impacted due to extremely fast dv/dt (e.g., change in voltage with respect to time) and di/dt (e.g., change in current with respect to time) related switching of SiC power devices relevant to each cluster. Therefore, the disclosed design of the upper gate driver board 304 and the lower gate driver board 306 includes the tightly grouped circuit clusters that isolate high voltage deviation and/or high changes in the voltage of one phase with respect to the others. Additionally, the clusters 602, 604, and 606 are related to the clusters 504, 506, and 508, and driver circuit clusters 510, 512, and 514 and the clusters of traces 516, 518, and 520. For example, the first high voltage phase circuit cluster 602 receives the signals passed through the connector by the first high voltage phase circuit cluster 504 and/or the first high voltage phase driver circuit cluster 510 for regulated power supplies via the first cluster of traces 516. The first high voltage phase circuit cluster 602 is also electrically coupled to power switches of the power switching assembly 210. Similar relationships are present for clusters 604 and 606.

Due to the stacked nature of the multi-board gate driver (e.g., 304 and 306), tightly grouped circuitry is positioned above related tightly grouped circuitry (e.g., circuitry that operates on the same or similar signals and that is referenced to the same ground plain). This positioning advantageously reduces the electrical distance traveled by the signals in the circuitry despite the physical distance being relatively large. For example, because related circuitry overlaps with one another, the current passing through that related circuitry only perceives a minimal electrical distance. This positioning advantageously reduces electrical and magnetic coupling and allows, in part, for the overall package size of the SiC inverter to be reduced. As such, although electrical signals travel long physical distances, the electrical distance travelled is negligible due to the placement of circuity and laminated traces routed for critical signals, such as PWM and Desat detector. To ensure high performance signal integrity is maintained, example routing disclosed herein pairs PWM and Desat signals with dedicated ground traces in addition to voltage phase ground plains beneath traces for the PWM and Desat signals.

Figure 7:
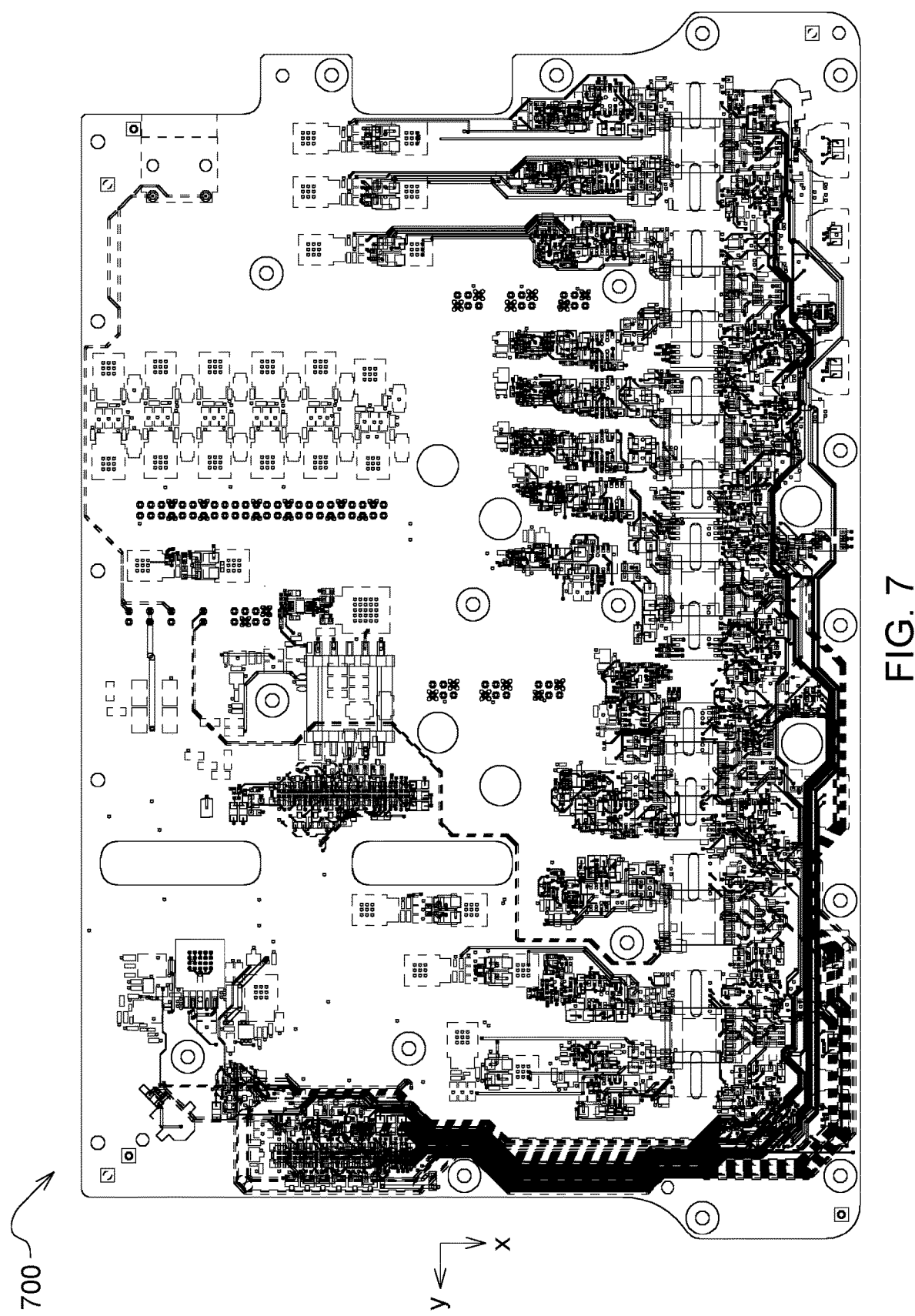
FIG. 7 is a schematic illustration of the bottom-side view of the upper gate driver board.

FIG. 7 is a schematic illustration of the bottom-side view 700 of the upper gate driver board 304. As described above, only the high voltage generator circuit clusters have been discussed with respect to FIGS. 5 and 6. However, the techniques and advantages thereof additionally apply to the low voltage clusters and/or high voltage clusters and circuits design techniques of the high voltage generator are applicable to the circuits of the AC motor, and to the circuits for the electric braking system. For example, similar techniques are presented between the top-side and bottom-side of the upper gate driver board 304 and the lower gate driver board 306, respectively, as well as between top-side and bottom-side of the upper gate driver board 304 and the top-side and bottom-side of the lower gate driver board 306.

Figure 8:
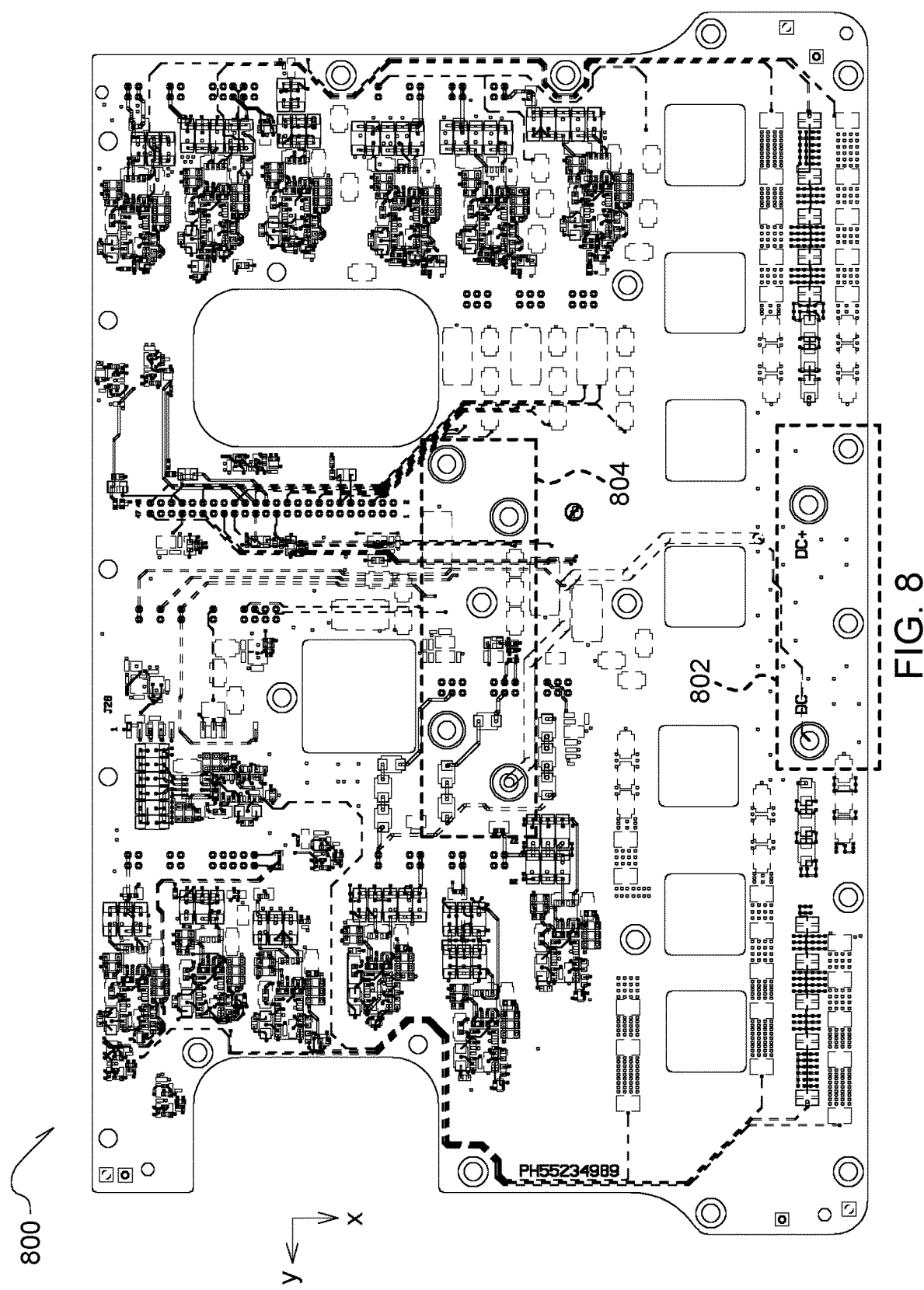
FIG. 8 is a schematic illustration of the bottom-side view of the lower gate driver board.

FIG. 8 is a schematic illustration of the bottom-side view 800 of the lower gate driver board 306. As described above, only the high voltage generator circuit clusters have been discussed with respect to FIGS. 5 and 6. However, the techniques and advantages thereof additionally apply to the low voltage clusters and/or high voltage clusters and circuits design techniques of the high voltage generator are applicable to the circuits of the AC motor, and to the circuits for the electric braking system. For example, similar techniques are presented between the top-side and bottom-side of the upper gate driver board 304 and the lower gate driver board 306, respectively, as well as between top-side and bottom-side of the upper gate driver board 304 and the top-side and bottom-side of the lower gate driver board 306.

Additionally, the bottom-side view 800 of the lower gate driver board 306 includes example through holes 802 and example through holes 804. The example through holes 802 are DC+ and DC− plated-holes to receive screws and pass the screws to the DC+ and DC− terminals of the DC bus bar 206. The through holes 802 eliminate ribbon connector resulting in improved reliability and elimination of a significant failure mode. The example through holes 804 are DC+, DC−, and mid-point-holes, totaling in four through holes, that are connected with DC+ and DC− via traces. The through holes 804 (e.g. pair of DC+ and mid-point and pair of mid-point and DC−) connect bleed resistance by drive-through screws. This approach has eliminated high-voltage class wired connections resulting in improved reliability and elimination of a significant failure mode including high temperature related melt of insulation from of high voltage wires. Through holes 802 and through holes 804 are configured to receive drive through screws and as such, eliminate manufacturing steps during fabrication of the SiC inverter. As such, examples disclosed herein eliminate wired connections for a high-voltage sensing circuit and a self-discharge circuit of the SiC inverter (e.g., when the SiC inverter is not in operation).

Figure 9:
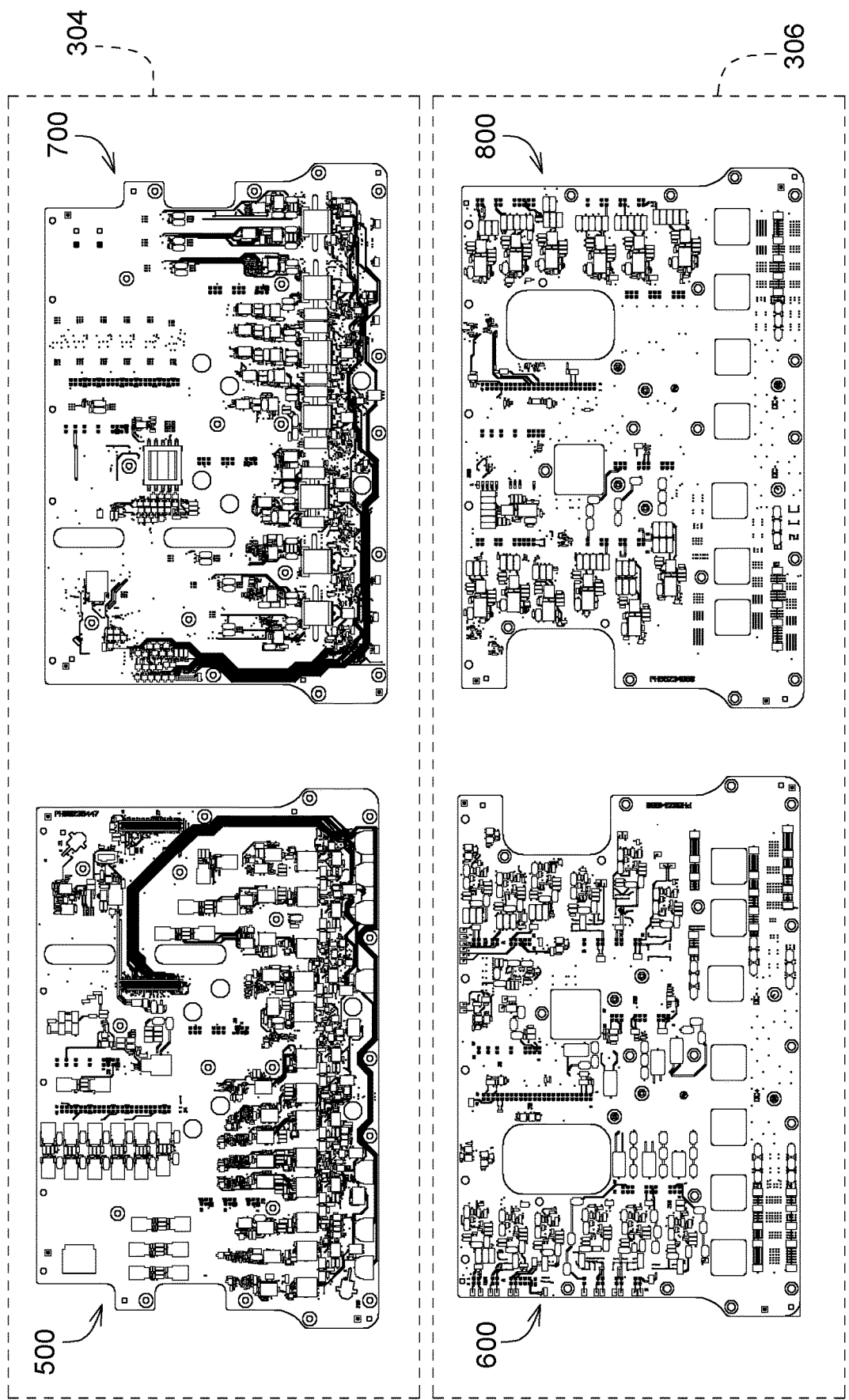
FIG. 9 is a schematic illustration of the top-side view and the bottom side view of the upper gate driver board and the top-side view and the bottom-side view of the lower gate driver board.

FIG. 9 is a schematic illustration of the top-side view 500 and the bottom-side view 700 of the upper gate driver board 304 and the top-side view 600 and the bottom-side view 800 of the lower gate driver board 306. FIG. 9 illustrates the overlap between the related clusters of circuits that results in minimal electrical distance travelled by signals.

FIG. 10 is a schematic illustration of a connector 1000 that can be used to couple the upper gate driver board 304 to the lower gate driver board 306. The connector 1000 is a press-fit connector including press-fit-pins 1002 on one side and solderable pins 1004 on the other side of board-to-board connector.

FIG. 11 is a schematic illustration of an alternative connector 1100 that can be used to couple the upper gate driver board 304 to the lower gate driver board 306. The connector 1100 is a press-fit connector including press-fit-pins 1102 and 1104 on both sides of the board-board connector. The connector 1000 adds manufacturing complexities and is prone to introduce manufacturing defects while the connector 1100 significantly simplifies manufacturing processes, lowers manufacturing cost and eliminates manufacturing defects.

Figure 12:
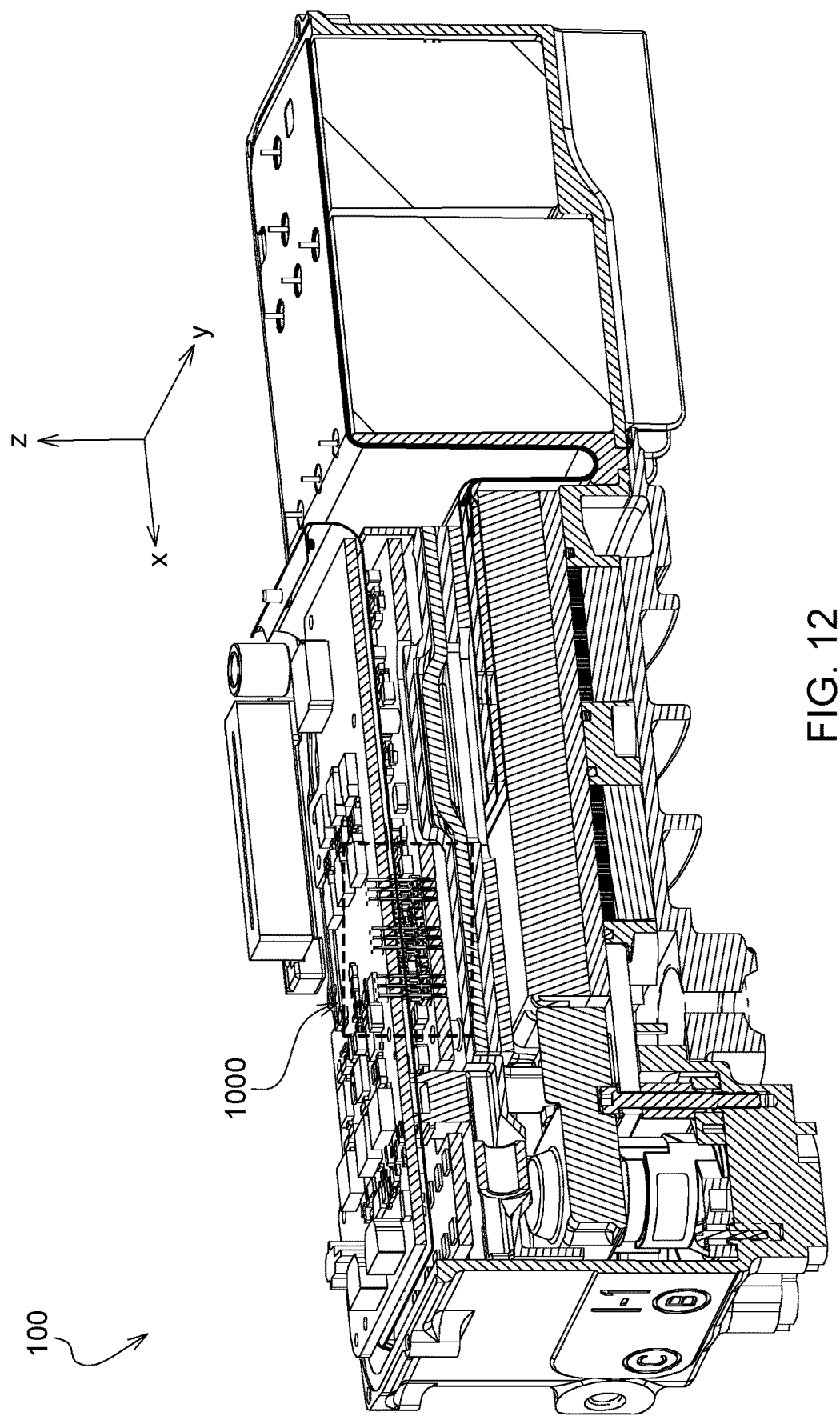
FIG. 12 is a schematic illustration of an isometric view of a cross-section of a portion of the assembly of FIG. 1.

FIG. 12 is a schematic illustration of an isometric view of a cross-section of a portion of the assembly 100 of FIG. 1. The isometric view illustrates the connector 1000 connecting the upper gate driver board 304 and the lower gate driver board 306. In alternative examples, the connector 1100 connects the upper gate driver board 304 and the lower gate driver board 306.

Figure 13:
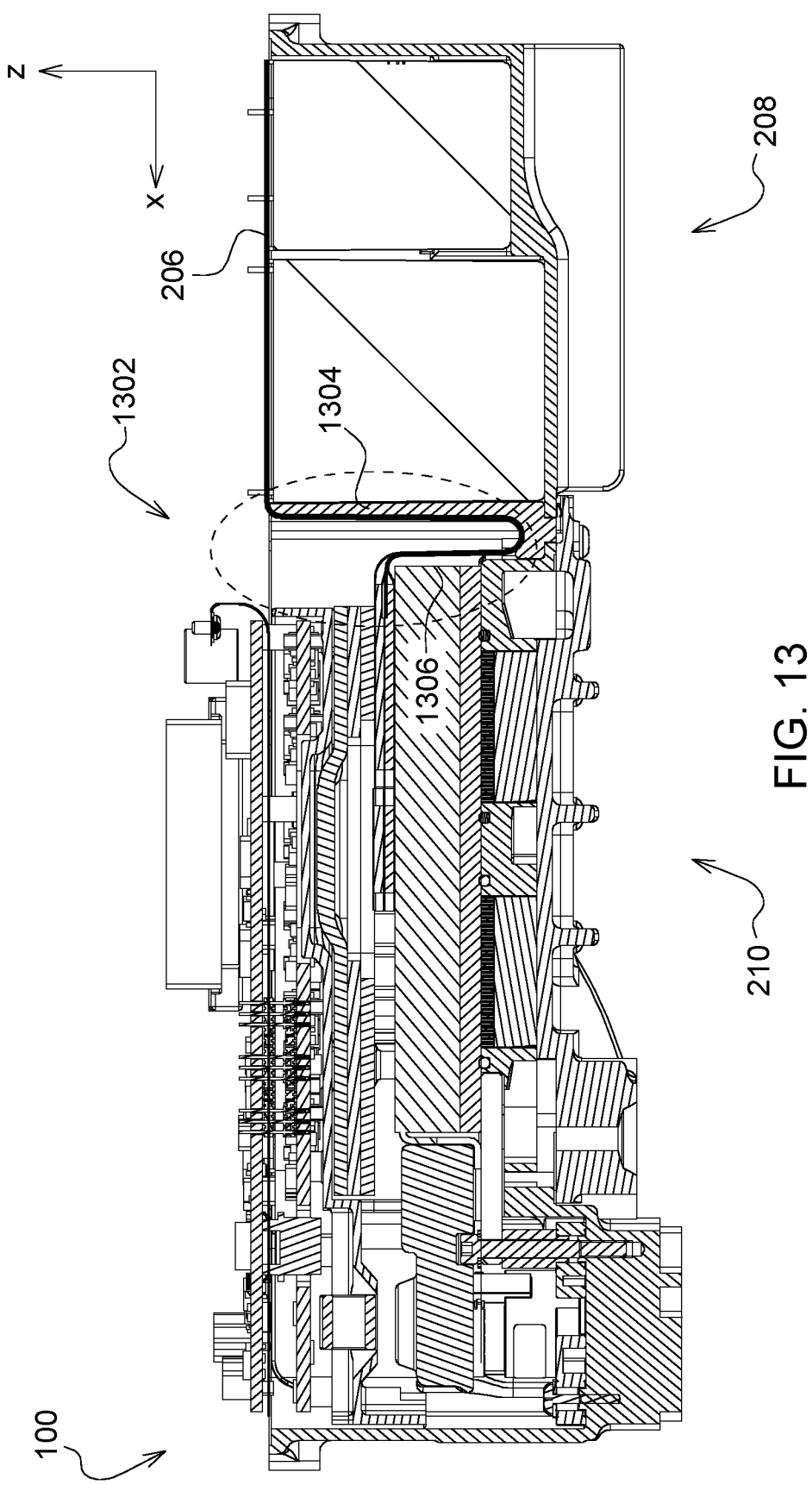
FIG. 13 is a schematic illustration of a right-side view of a cross-section of the portion of the assembly of FIG. 1 shown in FIG. 12.

FIG. 13 is a schematic illustration of a right-side view of a cross-section of the portion of the assembly 100 of FIG. 1 shown in FIG. 12. The right-side view includes the example DC bus bar 206, the example capacitor bank 208, the example power switching assembly 210, an example cavity 1302, an example front face 1304 of the capacitor bank 208, and an example rear face 1306 of the power switching assembly 210. The DC bus bar 206 includes two subregions, a first subregion that is positioned above the capacitor bank 208 with an approximately congruent surface area (e.g., a substantially similar) to that of the top side of the capacitor bank 208 and a second subregion that curves downward along the front face 1304 of the capacitor bank 208 and extends into the cavity 1302 between the capacitor bank 208 and the rear face 1306 of the power switching assembly 210. In examples disclosed herein, the second subregion of the region of the DC bus bar 206 associated with the capacitor bank 208 is tapered slightly but includes a relatively large surface area similar to that of the front face of the capacitor bank 208. The large surface area of the DC bus bar 206 enabled by the first subregion and the second subregion ensures that heat flow path from the power switching assembly 210 to the capacitor bank 208 is thermally decoupled (e.g., disconnected). For example, the large surface area of the DC bus bar 206 enabled by the first subregion and second subregion ensures that peaks in a temperature of one or more the capacitors of the capacitor bank are avoided despite heat generated by the power switching assembly 210. Thus, the capacitor bank 208 is effectively thermally coupled to ambient temperature of the environment around the assembly 100 which results in improved reliability and durability of the SiC inverter.

Figure 14:
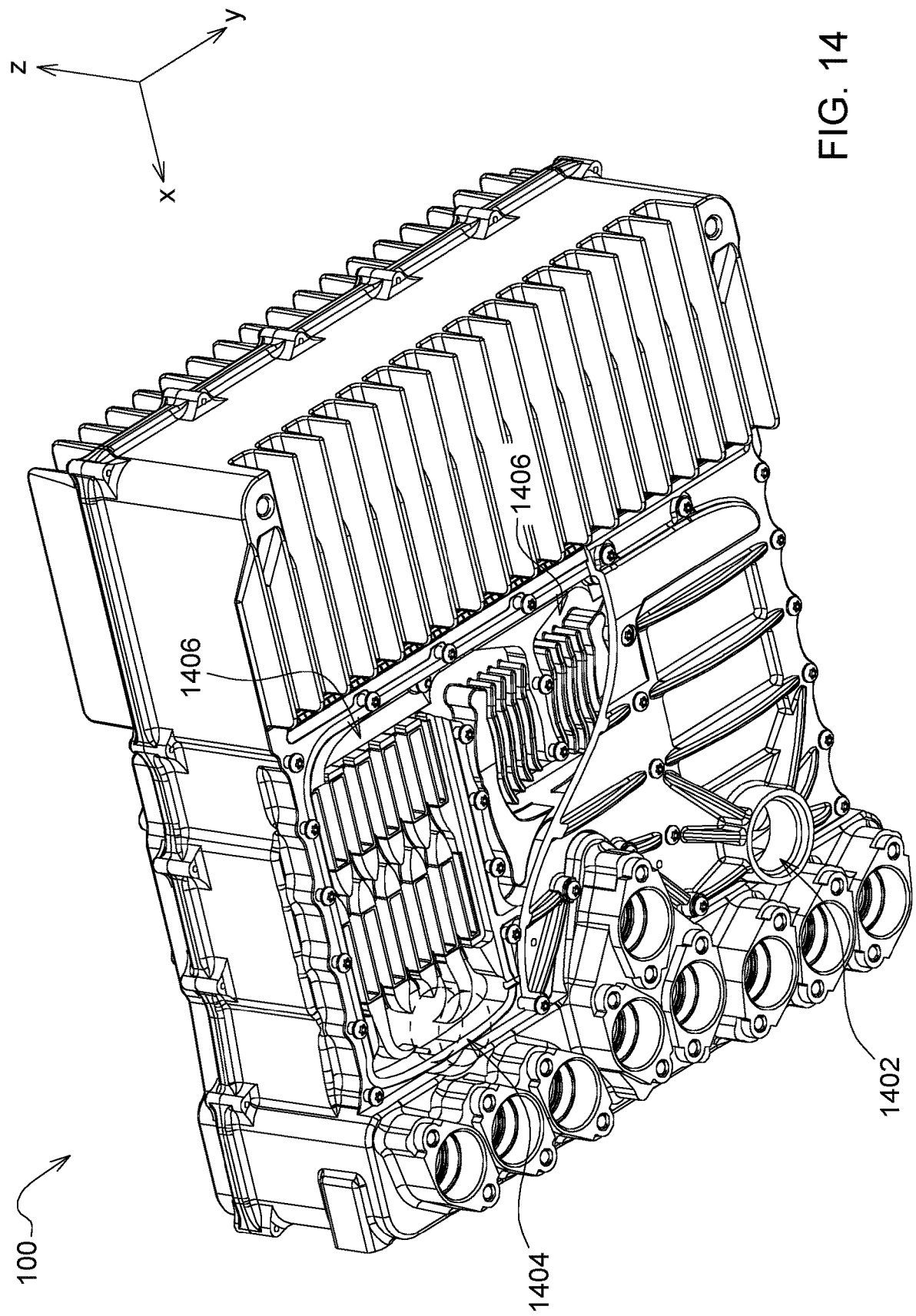
FIG. 14 is a schematic illustration of an isometric view of the assembly of FIG. 1 with a portion of the manifold cover removed.

FIG. 14 is a schematic illustration of an isometric view of the assembly 100 of FIG. 1 with a portion of the manifold cover 216 removed. FIG. 14 illustrates the manifold and channels of the cooling system of the power switching assembly 210. FIG. 14 includes an example inlet 1402, an example outlet 1404, and an example upper manifold 1406. Coolant flows from the inlet 1402, through the upper manifold 1406, the lower manifold (discussed in connection with FIGS. 15, 18, 19, and 20), and the channels (discussed in connection with FIGS. 16, 17, 18, 19, and 20), to the outlet 1404. As such, the lower manifold 1502 ejects the coolant at the outlet 1404 after the coolant has absorbed heat produced by the power switching modules of the power switching assembly 210.

Figure 15:
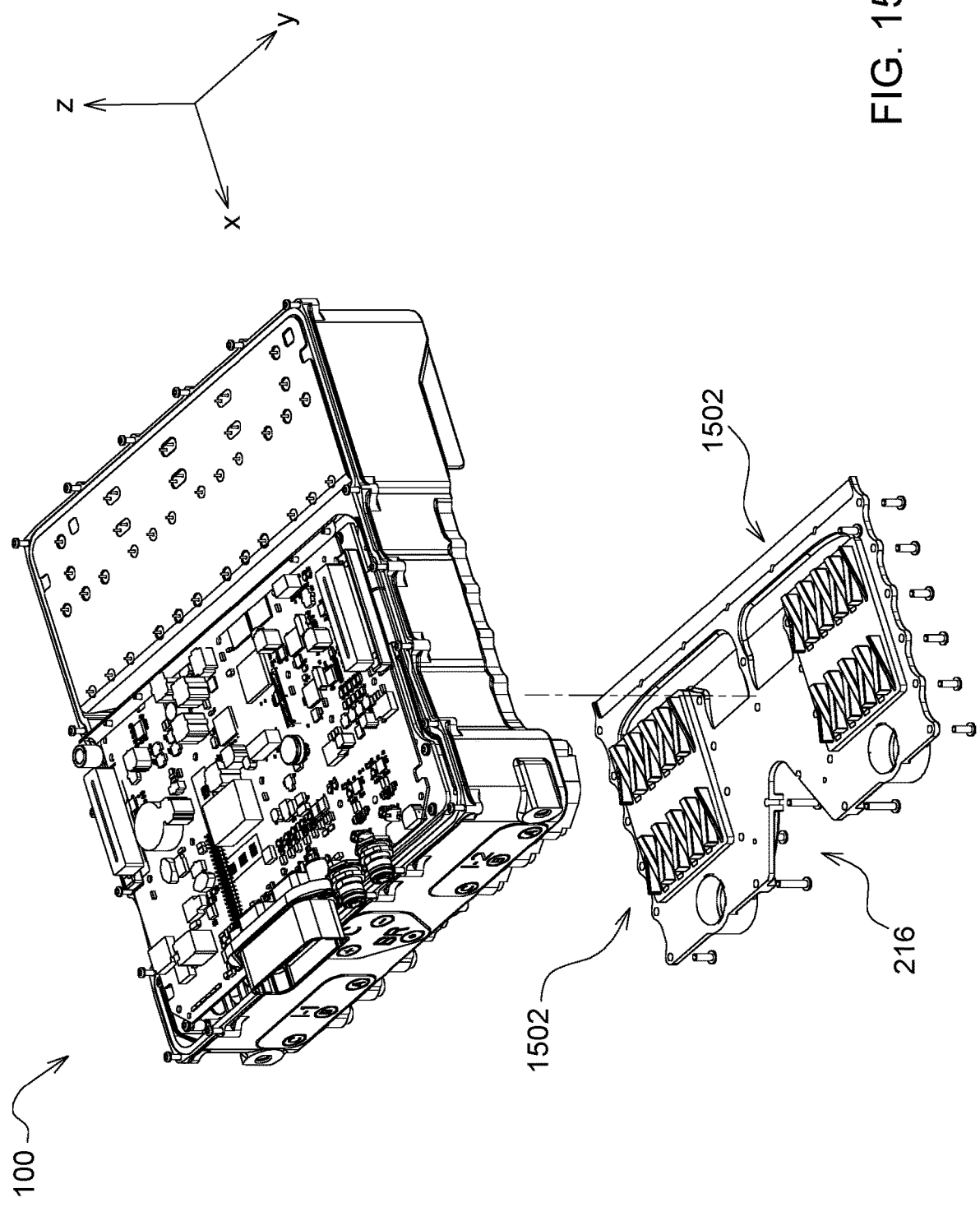
FIG. 15 is a schematic illustration of a partially exploded view of a portion of the assembly of FIG. 1.

FIG. 15 is a schematic illustration of a partially exploded view of a portion of the assembly 100 of FIG. 1. FIG. 15 illustrates the lower manifold 1502 engraved on the interior of the manifold cover 216.

Figure 16:
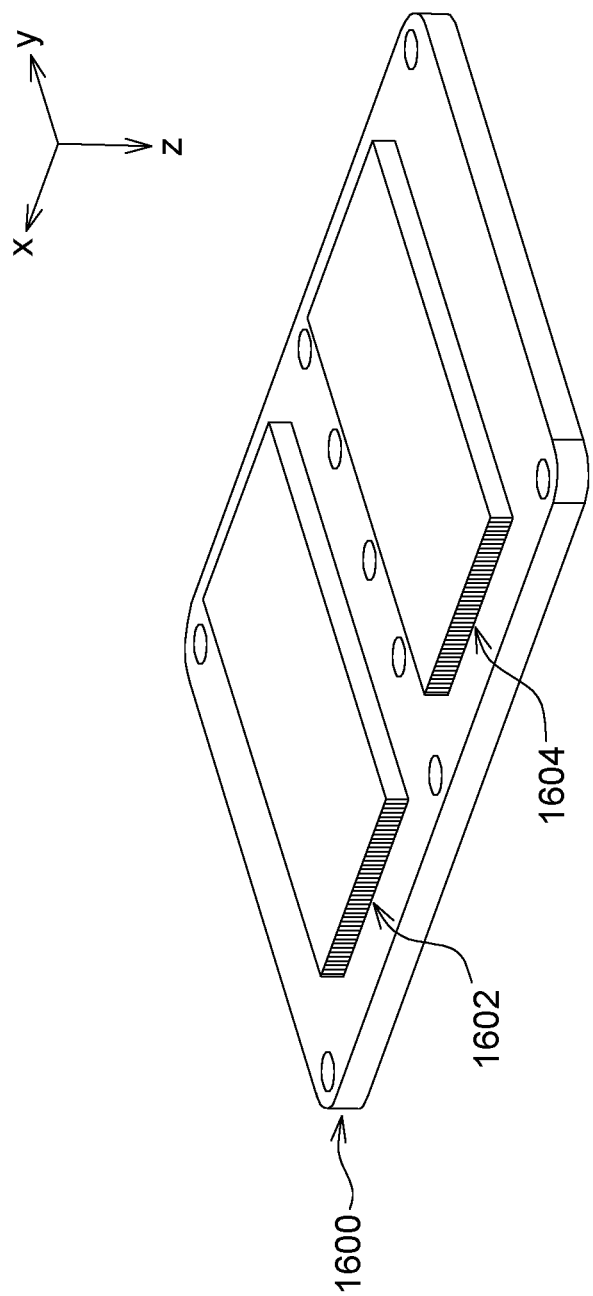
FIG. 16 is a schematic illustration of a baseplate of the power switching module.

FIG. 16 is a schematic illustration of a baseplate 1600 of the power switching module 312. The baseplate 1600 includes example channel section 1602 corresponding to a first set of SiC switches of the power switching module 312 and example channel section 1604 corresponding to a second set of SiC switches of the power switching module 312. The channel sections 1602 and 1604 are just below the SiC die of the respective SiC switches and engraved in the copper baseplate 1600 of the power switching module 312. Each of the channel sections 1602 and 1604 covers an area of 70 millimeters (mm) by 35.7 mm and includes approximately 80 channels.

Figure 17:
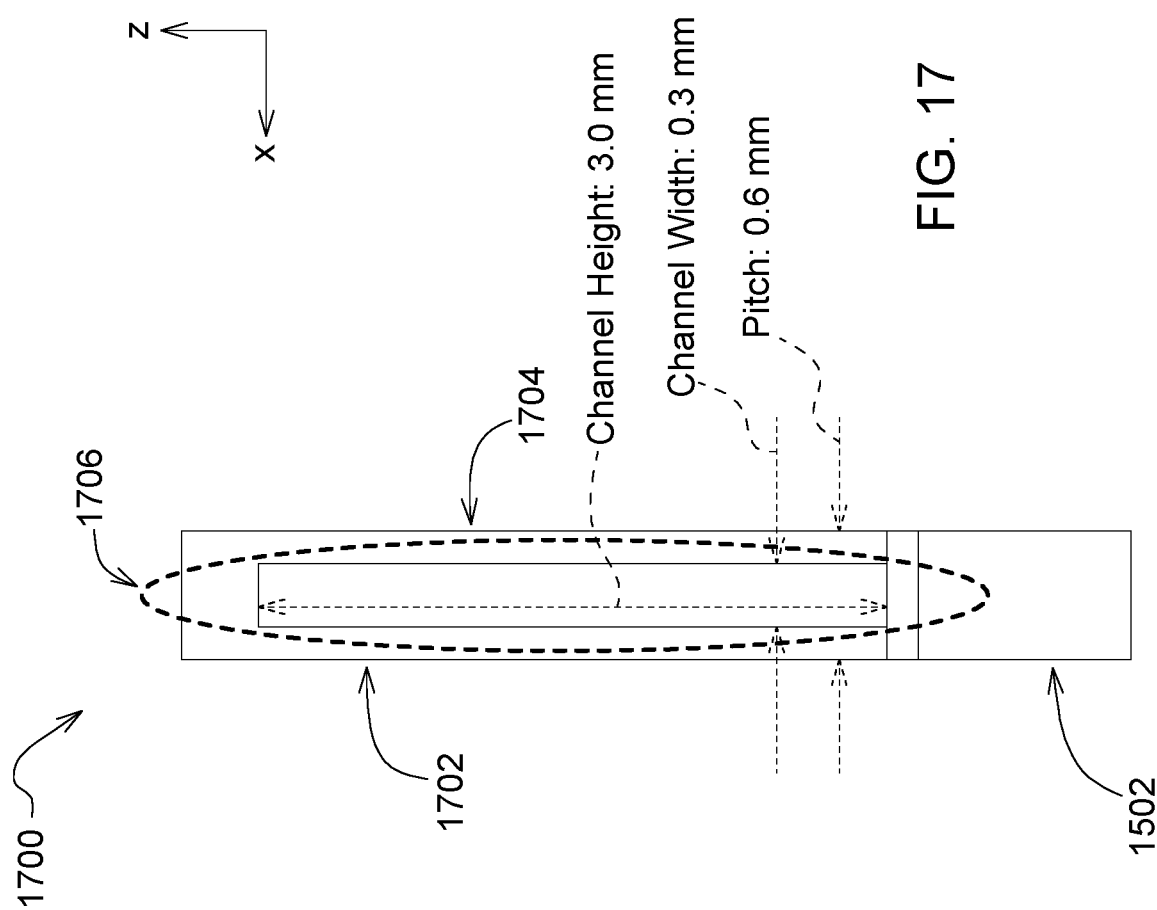
FIG. 17 is a schematic illustration of the geometry of an individual channel of the channel section of FIG. 16.

FIG. 17 is a schematic illustration of the geometry of an individual channel 1700 of the channel section 1602 of FIG. 16. The channel 1700 includes an example first fin 1702, and example second fin 1704, and an example cavity 1706. In the example of FIG. 17, the width of the channel 1700 (e.g., the distance between the interior sides of the first fin 1702 and the second fin 1704) is 0.3 mm and the height of the channel 1700 (e.g., the depth of the cavity 1706 in the Z-direction) is 3 mm (e.g., three millimeters). The pitch of the example channel 1700 is 0.6 mm. The bottom of the channel 1700 contacts the lower manifold 1502.

Figure 18:
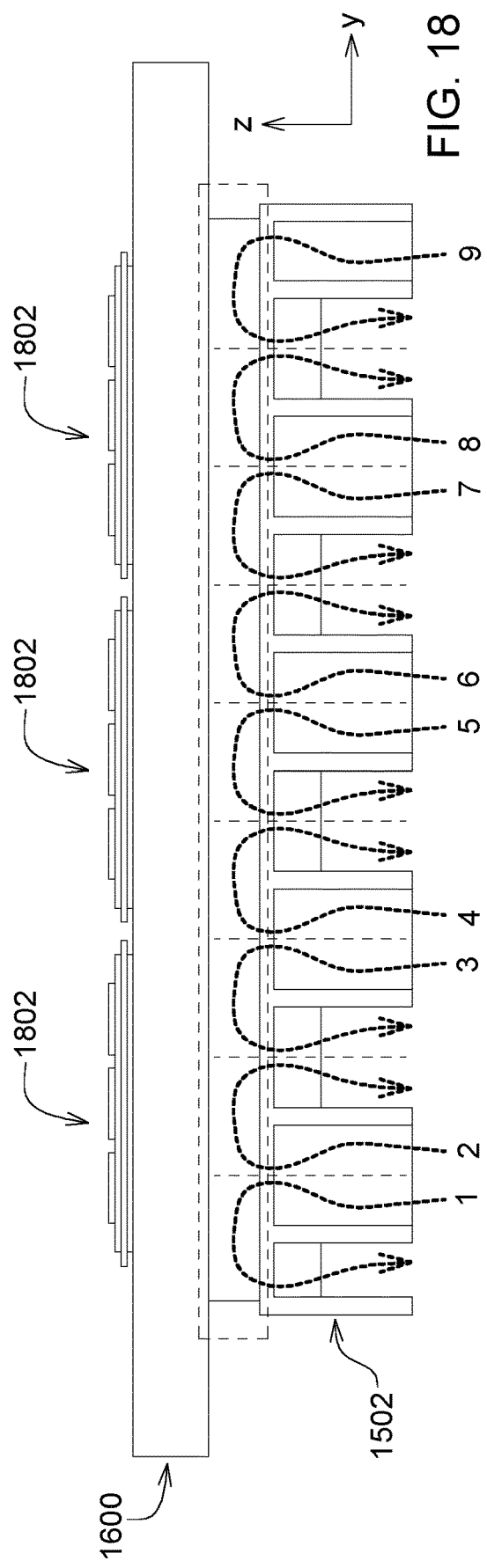
FIG. 18 is a schematic illustration of a front-side view of the channel section interfacing with the lower manifold.

FIG. 18 is a schematic illustration of a front-side view of the channel section 1602 interfacing with the lower manifold 1502. In the example of FIG. 18, the lower manifold 1502 is positioned beneath the channel section 1602 in such a way that the lower manifold 1502 causes jet impingement (e.g., is to cause jet impingement) of coolant flowing into the channel section 1602. For example, lines 1, 2, 3, 4, 5, 6, 7, 8, and 9 illustrate the coolant flowing into and out of the channel section 1602. As the coolant flows through the channel section 1602 and into the coolant passage built-in the lower manifold 1502, the coolant absorbs heat dissipated by a first set of SiC switches 1802 corresponding to the channel section 1602. In examples disclosed herein, the coolant can reach a temperature of 115° C. (e.g., one hundred and fifteen degrees Celsius).

The example jet impingement process caused by the channels and manifolds disclosed herein creates turbulent motion of the coolant flowing through the channels (e.g., the channel section 1602) resulting in extremely high (e.g., >4,000) Reynold number. As such, examples disclosed herein retain turbulent motion even with the low flow rate and insignificant pressure drop of coolant through the SiC inverter. With the reduced delta in pressure drops, examples disclosed herein reduce the pumping power expended by the coolant pump. The channel and manifold based cooling techniques disclosed herein result in extremely high transfer coefficient (e.g., >90 kW/(m$^2$-K)).

Figure 19:
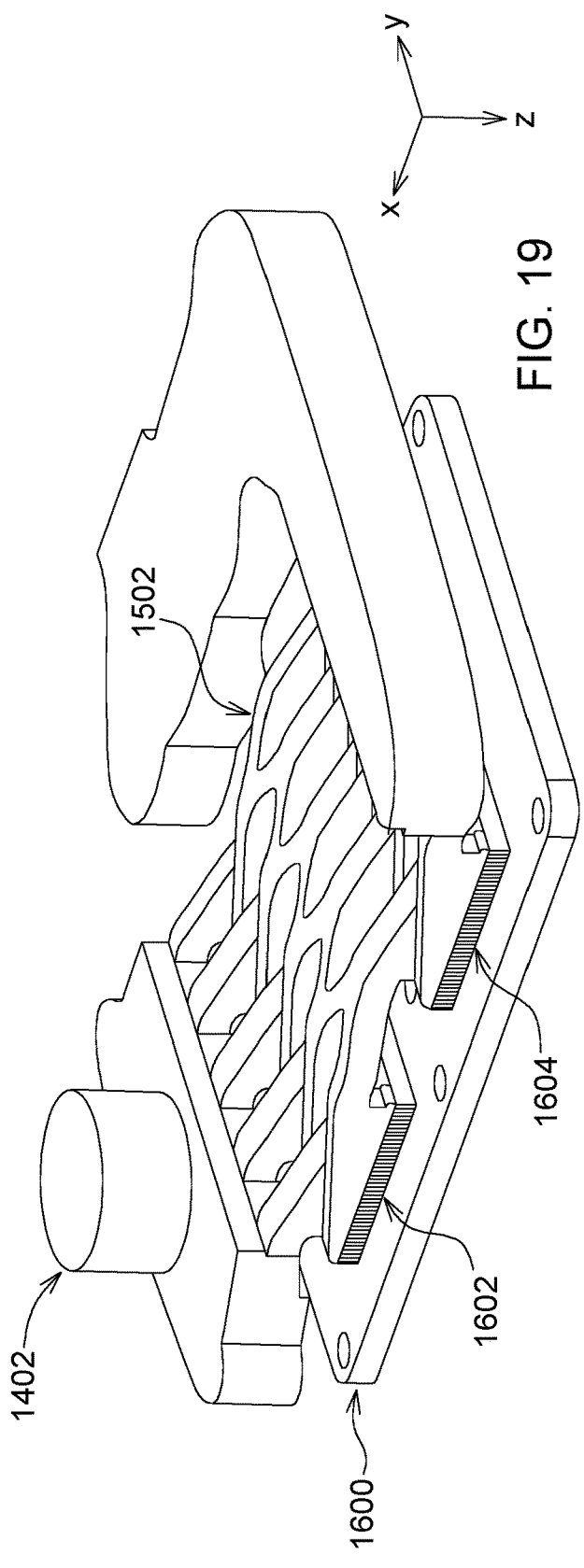
FIG. 19 is a schematic illustration of a portion of the manifold cover of FIGS. 2, 14, and 15 illustrating how the channels and the manifolds interface with the baseplate of the power switching module.

FIG. 19 is a schematic illustration of a portion of the manifold cover 216 of FIGS. 2, 14, and 15 illustrating how the channels and the manifolds interface with the baseplate 1600 of the power switching module 312. In the example of FIG. 19, the lower manifold 1502 is inserted into the upper manifold 1406 when the manifold cover 216 is attached. The channels and the manifold based cooling technology described herein is applicable and can be extended to any power switching module no matter the manufacturer or type of power semiconductor technology used. For example, the cooling technology described herein can be applied to Si IGBTs, SiC MOSFETs and GaN high electron mobility transistors (HEMTs). The channels and the manifold cooling technology can also be extended to cool large surface area underneath the AC output bus bars to actively cool down interconnects between the SiC inverter and electric machine such as electric motor and electric generator.

Figure 20:
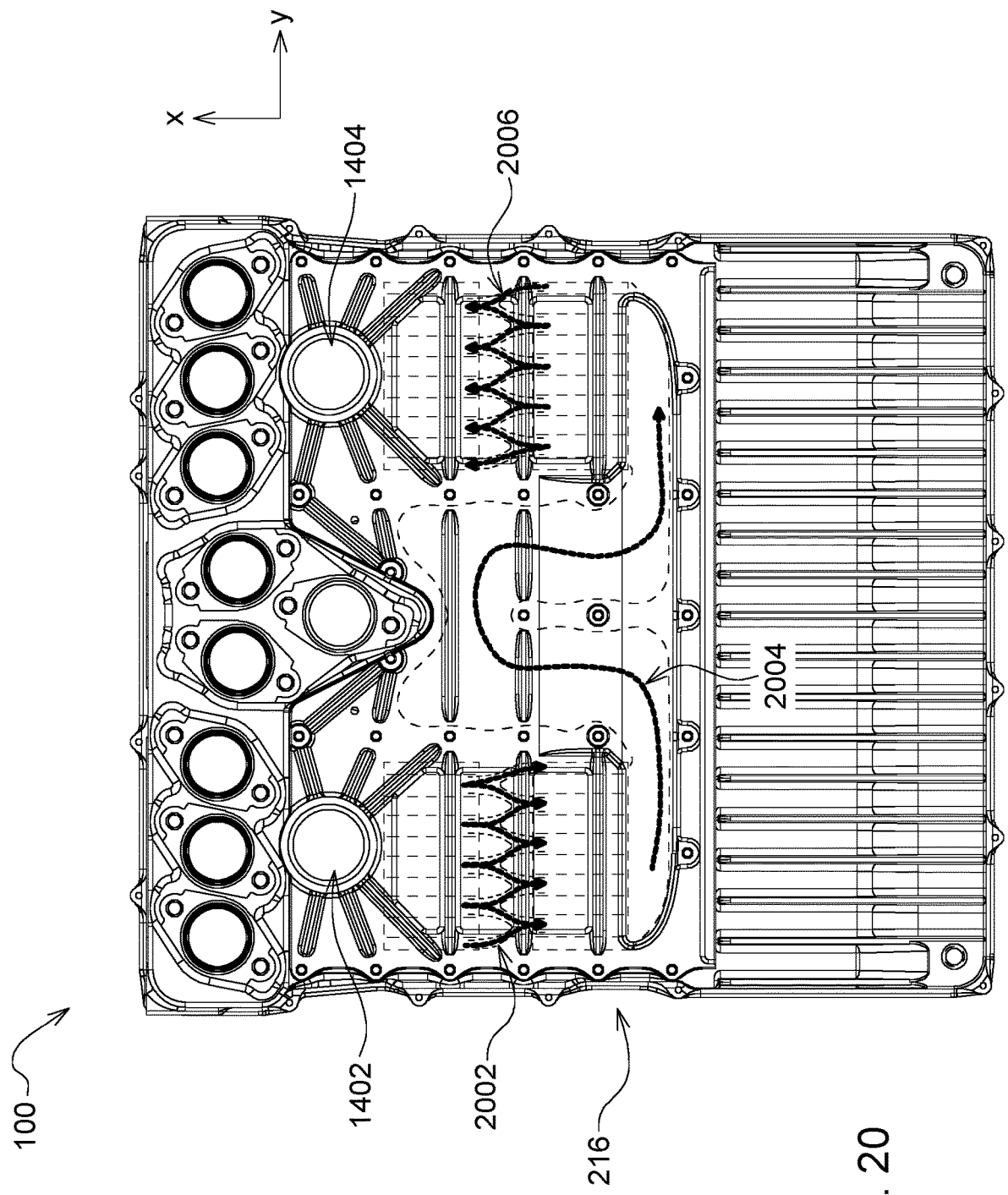
FIG. 20 is a schematic illustration of a bottom-side view of the assembly of FIG. 1 with the manifold cover illustrated opaquely.

FIG. 20 is a schematic illustration of a bottom-side view of the assembly 100 of FIG. 1 with the manifold cover 216 illustrated opaquely. In the example of FIG. 20, coolant flows from the inlet 1402 through first channels and manifolds, as illustrated by lines 2002, as the coolant absorbs heat from a first power switching module. The coolant passes through the coolant passage as illustrated by line 2004. The coolant passes through second channels and manifolds, as illustrated by lines 2006, as the coolant absorbs heat from a second power switching module. Subsequently, the coolant flows out the outlet 1404.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
   a first printed circuit board (PCB) including:
     a first voltage phase circuit cluster;
     a second voltage phase circuit cluster; and
     a cluster of traces, the cluster of traces routed substantially perpendicular to the second voltage phase circuit cluster;
   a second PCB positioned below the first PCB; and
   a connector to connect the first PCB to the second PCB, the connector electrically coupled to the first voltage phase circuit cluster by the cluster of traces.

2. The apparatus of claim 1, wherein the substantially perpendicular routing of the cluster of traces with respect to the second voltage phase circuit cluster is to decouple a first signal to be transmitted within the first voltage phase circuit cluster from a second signal to be transmitted within the second voltage phase circuit cluster, the decoupling including at least one of electrical decoupling or magnetic decoupling.

3. The apparatus of claim 1, wherein circuits of the first voltage phase circuit cluster are grouped to isolate a change in a voltage level of a first signal to be transmitted within the first voltage phase circuit cluster from a second signal to be transmitted within the second voltage phase circuit cluster.

4. The apparatus of claim 1, wherein the connector includes:
   first press-fit-pins to be inserted into the first PCB; and
   second press-fit-pins to be inserted into the second PCB.

5. The apparatus of claim 1, wherein the second PCB includes a third voltage phase circuit cluster, the third voltage phase circuit cluster electrically coupled to power switches, the connector, and the first voltage phase circuit cluster, the first and third voltage phase circuit clusters to drive the power switches.

6. The apparatus of claim 5, wherein the power switches are first power switches, the second voltage phase circuit cluster is to drive second power switches, and the first voltage phase circuit cluster is positioned above the third voltage phase circuit cluster to reduce coupling between a first signal transmitted within the first and third voltage phase circuit clusters and a second signal transmitted within the second voltage phase circuit cluster by reducing an electrical distance traveled by the first signal, the coupling including at least one of electrical coupling or magnetic coupling.

7. The apparatus of claim 5, further including:
   a cylindrical ferrite core to reduce at least one of noise, electrical coupling, or magnetic coupling between high frequency operation of the power switches and a signal generated by a current sensor monitoring the power switches; and a wire-based connector to receive wires passing through the cylindrical ferrite core.

\* \* \* \* \*

UNITED STATES PATENT AND TRADEMARK OFFICE
CERTIFICATE OF CORRECTION

PATENT NO. : 11,489,417 B2
APPLICATION NO. : 17/072988
DATED : November 1, 2022
INVENTOR(S) : Singh Page 1 of 1

It is certified that error appears in the above-identified patent and that said Letters Patent is hereby corrected as shown below:

On the Title Page

Item (54) and in the Specification, Column 1, Lines 1-2, under "Title", delete "PACKAGING OF WIDE BANDGAP POWER ELECTRONIC POWER STAGES" and insert --"DESIGN AND PACKAGING OF WIDE BANDGAP POWER ELECTRONIC POWER STAGES"--.

Signed and Sealed this
Twenty-fifth Day of April, 2023

Katherine Kelly Vidal
*Director of the United States Patent and Trademark Office*